(12) United States Patent
Choe et al.

(10) Patent No.: US 8,916,926 B2
(45) Date of Patent: Dec. 23, 2014

(54) NONVOLATILE MEMORY DEVICE AND METHOD OF MAKING THE SAME

(75) Inventors: Byeong-In Choe, Yongin-si (KR); Sunil Shim, Seoul (KR); Sung-Hwan Jang, Bucheon-si (KR); Woonkyung Lee, Seongnam-si (KR); Jaehoon Jang, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 503 days.

(21) Appl. No.: 13/310,407

(22) Filed: Dec. 2, 2011

(65) Prior Publication Data

US 2012/0140562 A1 Jun. 7, 2012

(30) Foreign Application Priority Data

Dec. 2, 2010 (KR) ........................ 10-2010-0122275

(51) Int. Cl.
*H01L 27/115* (2006.01)
*G11C 16/04* (2006.01)
*H01L 29/792* (2006.01)

(52) U.S. Cl.
CPC ...... *H01L 27/1157* (2013.01); *H01L 27/11582* (2013.01); *H01L 29/7926* (2013.01); *G11C 16/0483* (2013.01)
USPC .... 257/329; 257/324; 257/326; 257/E27.103; 257/E29.262; 257/E29.309; 365/185.18; 365/185.24

(58) Field of Classification Search
CPC ..................... H01L 27/1157; H01L 27/11578; H01L 29/792; H01L 29/7926; G11C 16/04; G11C 16/0408; G11C 16/0433; G11C 16/0466
USPC .......... 257/324, 326, 329, E27.103, E29.262, 257/E29.309; 365/185.18, 185.24
See application file for complete search history.

(56) References Cited

U.S. PATENT DOCUMENTS 7,696,559 B2 4/2010 Arai et al.
2008/0179659 A1 7/2008 Enda et al.
(Continued)

FOREIGN PATENT DOCUMENTS

JP 10-093083 4/1998
JP 2007-180389 7/2007
(Continued)

OTHER PUBLICATIONS

Y. Fukuzumi et al. "Optimal Integration and Characteristics of Vertical Array Devices for Ultra-High Density, Bit-Cost Scalable Flash Memory," IEEE International Electron Devices Meeting, 2007, pp. 449-452.
H. Tanaka et al., "Bit Cost Scalable Technology with Punch and Plug Process for Ultra High Density Flash Memory," IEEE Symposium on VLSI Technology, 2007, pp. 14-15.

* cited by examiner

*Primary Examiner* — Allison P Bernstein
(74) *Attorney, Agent, or Firm* — Volentine & Whitt, PLLC

(57) ABSTRACT

A nonvolatile memory device includes a substrate, a structure including a stack of alternately disposed layers of conductive and insulation materials disposed on the substrate, a plurality of pillars extending through the structure in a direction perpendicular to the substrate and into contact with the substrate, and information storage films interposed between the layers of conductive material and the pillars. In one embodiment, upper portions of the pillars located at the same level as an upper layer of the conductive material have structures that are different from lower portions of the pillars. In another embodiment, or in addition, upper string selection transistors constituted by portions of the pillars at the level of an upper layer of the conductive material are programmed differently from lower string selection transistors.

16 Claims, 31 Drawing Sheets

(56) References Cited

U.S. PATENT DOCUMENTS

| | | |
|---|---|---|
| 2009/0230450 A1 | 9/2009 | Shiino et al. |
| 2010/0019310 A1 | 1/2010 | Sakamoto |
| 2010/0159657 A1 | 6/2010 | Arai et al. |
| 2010/0207194 A1* | 8/2010 | Tanaka et al. ............... 257/324 |
| 2012/0112260 A1* | 5/2012 | Kim et al. .................... 257/315 |
| 2012/0139027 A1* | 6/2012 | Son et al. .................... 257/324 |

FOREIGN PATENT DOCUMENTS

| | | |
|---|---|---|
| JP | 2008-186868 | 8/2008 |
| JP | 2009-224574 | 10/2009 |
| JP | 2010-034112 | 2/2010 |
| KR | 1020080070583 A | 7/2008 |

Fig. 27

| | | |
|---|---|---|
| SSLb PGM | BL | VBL2 (7V) |
| | SSLb | VSSL4 (7V) |
| | SSLa | VSSL3 (VSS) |
| | DWL | VDWL (7V) |
| | WL | VWL (7V) |
| | GSL | VGSL (7V) |
| | CSL | VCSL (VSS) |
| SSLa PGM | BL | VBL1 (VSS) |
| | SSLb | VSSL2 (VSS) |
| | SSLa | VSSL1 (7V) |
| | DWL | VDWL (7V) |
| | WL | VWL (7V) |
| | GSL | VGSL (7V) |
| | CSL | VCSL (7V) |

# NONVOLATILE MEMORY DEVICE AND METHOD OF MAKING THE SAME

PRIORITY STATEMENT

This application claims the benefits, under 35 U.S.C §119, of Korean Patent Application No. 10-2010-0122275 filed Dec. 2, 2010, the entirety of which is incorporated by reference herein.

BACKGROUND

The inventive concept relates to nonvolatile semiconductor memory devices. More particularly, the inventive concept relates to 3-dimensional nonvolatile semiconductor memory devices.

Semiconductor memory devices may be classified as volatile and nonvolatile devices.

Volatile memory devices lose their stored data when the power being supplied to the devices is turned off. Examples of volatile memory devices include static RAMs (SRAMs), dynamic RAMs (DRAMs), and synchronous DRAM (SDRAMs). Nonvolatile memory devices, on the other hand, retain their stored data even when the power being supplied thereto is cut off. Therefore, nonvolatile memory devices are widely used in portable electronics, such as mobile phones and MP3 players. Examples of nonvolatile memory devices include read only memories (ROMs), programmable ROM (PROMs), electrically programmable ROMs (EPROMs), electrically erasable and programmable ROM (EEPROMs), flash memory devices, phase-change RAMs (PRAMs), magnetic RAMs (MRAMs), resistive RAMs (RRAMs), and ferroelectric RAMs (FRAMs). Flash memory devices can be roughly divided into NOR type and NAND type of devices.

Because of the growing demand for smaller portable electronics that can store greater amounts of data and perform greater numbers of functions, there is a corresponding demand for more highly integrated semiconductor devices, especially nonvolatile memory devices. To this end, semiconductor memory devices having a three-dimensional array of memory cells are being developed to provide increased integration density and data storage capacity.

SUMMARY

According to one aspect of the inventive concept, there is provide a nonvolatile memory device which comprises a substrate, a stack of alternately disposed layers of electrically conductive and insulating materials on the substrate, a plurality of pillars extending through the stack in a direction perpendicular to the substrate to the substrate and disposed in contact with the substrate, and information storage films interposed between the layers of conductive material and the pillars, and in which each of the pillars comprise a channel section adjacent the layers of conductive material and constituting vertical channels at substantially the same levels as the layers of conductive material, respectively, and in which an upper portion of the channel section adjacent an upper one of the layers of conductive material has a different degree of conductivity from each of the remaining portions of the channel section located adjacent the other layers of conductive material, respectively.

According to another aspect of the inventive concept, there is provided a nonvolatile memory device which comprises a substrate, and a plurality of cell strings on the substrate, in which each of the cell strings includes a plurality of cell transistor structures stacked in a direction perpendicular to the substrate, wherein a plurality of the cell transistor structures at the top of each of the cell strings constitute a plurality of string selection transistors, respectively, and in which at least two of the string selection transistors have different threshold voltages.

According to another aspect of the inventive concept, there is provided a nonvolatile memory device which comprises a substrate having a first region of a first conductivity type and a source region of a second conductivity type, and an array of cell strings on the substrate, and in which each of the cell strings comprises a respective stack of gate electrodes, a vertical pillar comprising semiconductor material of the first conductivity type contacting the first region the substrate, an information storage film interposed between each of the gate electrodes and the pillar, and a drain disposed on the pillar, in which the gate electrodes, the vertical pillar and the information storage film interposed between each of the gate electrodes and the pillar of each of the cell strings constitute a plurality of cell transistors including memory cell transistors, a lower string selection transistor disposed on the memory cell transistors and an upper string selection transistor disposed on the lower string selection transistor, and in which the upper and lower string selection transistors of each of the cell strings are characterized in that the upper string selection transistor of the cell string has a potential lower than that of the lower string selection transistor of the cell string when the cell string is program inhibited and the same voltage is applied to the upper and lower string selection transistors.

BRIEF DESCRIPTION OF THE DRAWINGS

The above and other aspects and features of the inventive concept will become more apparent from the following detailed description of the preferred embodiments thereof made with reference to the following figures, throughout which like reference numerals designate like parts, and of which:

FIG. 27 is a table of voltage conditions when string selection transistors are programmed, according to the inventive concept;

DETAILED DESCRIPTION OF THE PREFERRED EMBODIMENTS

Figure 1:
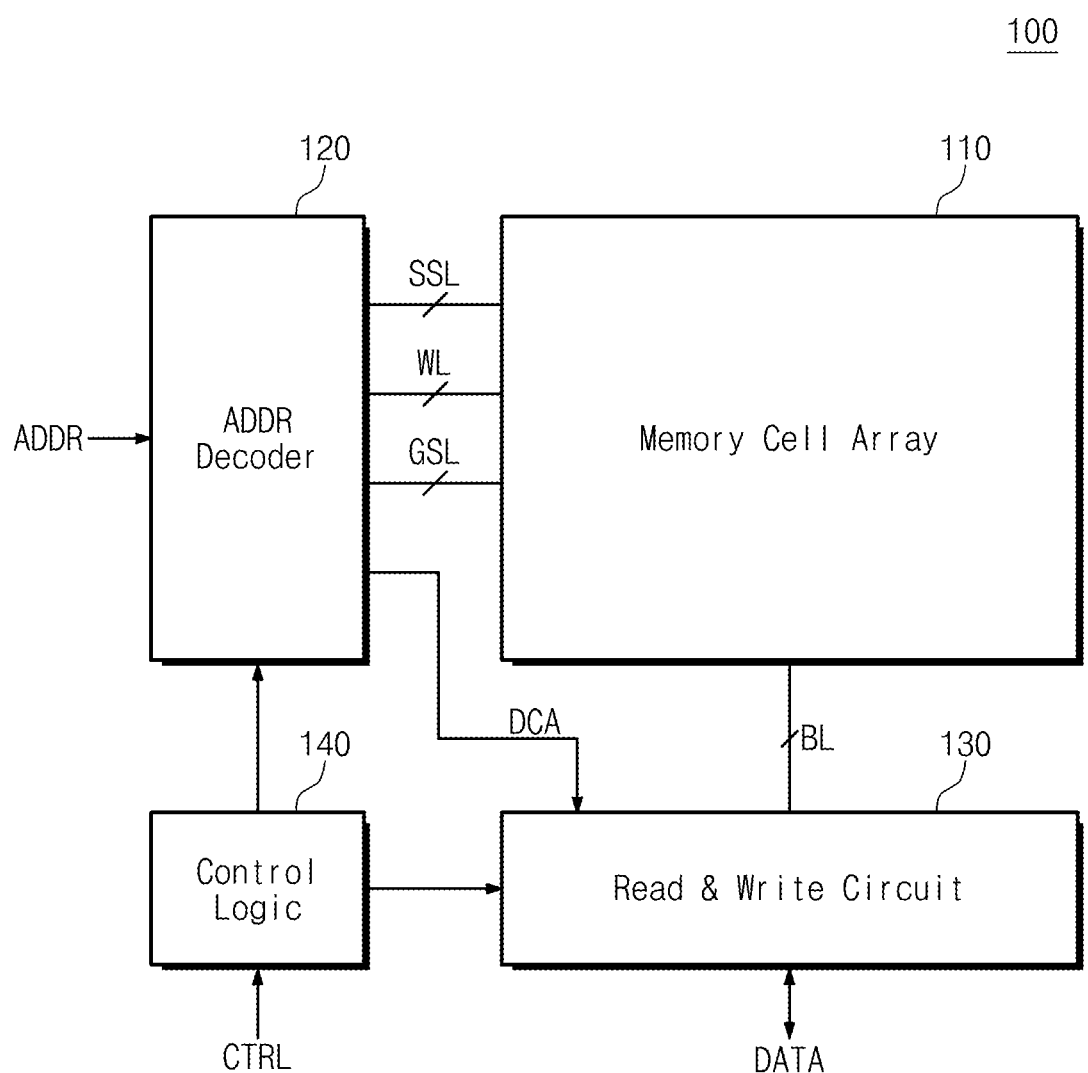
FIG. 1 is a block diagram of a nonvolatile memory device according to the inventive concept.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

Furthermore, spatially relative terms, such as "upper," and "lower" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use.

It will also be understood that when an element or layer is referred to as being "on" or "connected to" another element or layer, it can be directly on or directly connected to the other element or layer or intervening elements or layers may be present. In contrast, when an element or layer is referred to as being "directly on" or "directly connected to" another element or layer, there are no intervening elements or layers present.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes.

An embodiment of a nonvolatile memory 100 device according to the inventive concept will now be described in detail with reference to FIG. 1.

The nonvolatile memory device 100, of this embodiment, includes a memory cell array 110, an address decoder 120, a read/write circuit 130, and control logic 140.

The memory cell array 110 includes a plurality of memory cell groups on a substrate. In particular, the memory cell array 110 includes a three-dimensional array of memory cells on the substrate. Each memory cell stores one or more bits of data.

The address decoder 120 is coupled with the memory cell array 110 via word lines WL, string selection lines SSL, and ground selection lines GSL, and is configured to operate responsive to the control logic 140.

The address decoder 120 is also adapted to receive an address ADDR from an external device, and is configured to decode the address ADDR into a row address. In particular, the address decoder 120 may selects a word line corresponding to the decoded row address of the word lines WL or a string selection line and a ground selection line corresponding to the decoded row address.

The address decoder 120 may also be configured to decode the address ADDR into a column address DCA. The address decoder 120 provides the decoded column address DCA to the read/write circuit 130.

To these ends, the address decoder 120 may thus include a row decoder that derives a row address, and a column decoder that derives a column address. In addition, the address decoder may also include an address buffer that stores the input address ADDR.

Furthermore, in this embodiment of a nonvolatile memory device according to the inventive concept, the read/write circuit 130 is coupled with the memory cell array 110 via bit lines BL. The read/write circuit 130 is also configured to exchange data with an external device and to operate responsive to the control of the control logic 140. In particular, the read/write circuit 130 selects bit lines BL in response to the column address DCA provided by the address decoder 120.

In this embodiment, the read/write circuit 130 receives data from an external device and writes it in the memory cell array 110. The read/write circuit 130 may also read data from the memory cell array 110 and output the data to the external device. The read/write circuit 130 may also read data from a first storage area of the memory cell array 110 and write it in a second storage area of the memory cell array 110. That is, the read/write circuit 130 may perform a copy-back operation.

In one example of this embodiment, the read/write circuit 130 comprises a page buffer (or a page register), a column selecting circuit, and a data buffer. In another example, the read/write circuit 130 comprises a sense amplifier, a write driver, a column selecting circuit, and a data buffer.

As mentioned above, the control logic 140 is coupled with the address decoder 120 and the read/write circuit 130. The control logic 140 may thus or otherwise be configured to control the overall operation of the nonvolatile memory device 100.

Figure 2:
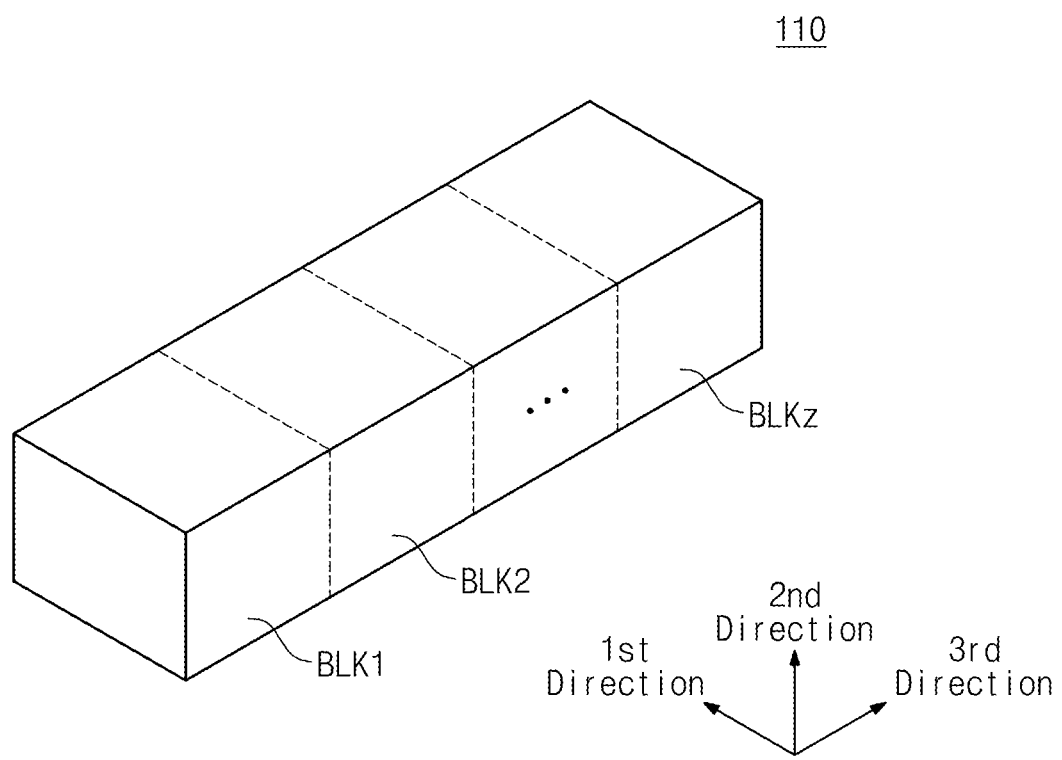
FIG. 2 is a schematic diagram of a memory cell array of the device of FIG. 1.

The memory cell array 110 of the device of FIG. 1 will now be described in more detail with reference to FIG. 2. The memory cell array 110 includes a plurality of memory blocks BLK1 to BLKz, each of which has a three-dimensional (or a vertical) structure. For example, each of the memory blocks BLK1 to BLKz may include a plurality of cell strings CS (refer to FIG. 6, as well), with each cell string CS extending upright in a second direction and with the plurality of cell strings CS arrayed along first and third directions.

Each cell string CS is connected with a bit line BL, a string selection line SSL, a plurality of word lines WL, a ground selection line GSL, and a common source line CSL. Each memory block is connected with a plurality of bit lines BL, a plurality of string selection lines SSL, a plurality of word lines WL, a ground selection line GSL, and a common source line CSL. The memory blocks BLK1 to BLKz will be more fully described with reference to FIGS. 3 to 6.

In the illustrated example of this embodiment, the plurality of memory blocks BLK1 to BLKz are all selectable by the address decoder 120. More specifically, the address decoder 120 is configured to select a memory block, from among the plurality of memory blocks BLK1 to BLKz, corresponding to the address ADDR input to the address decoder.

Figure 3:
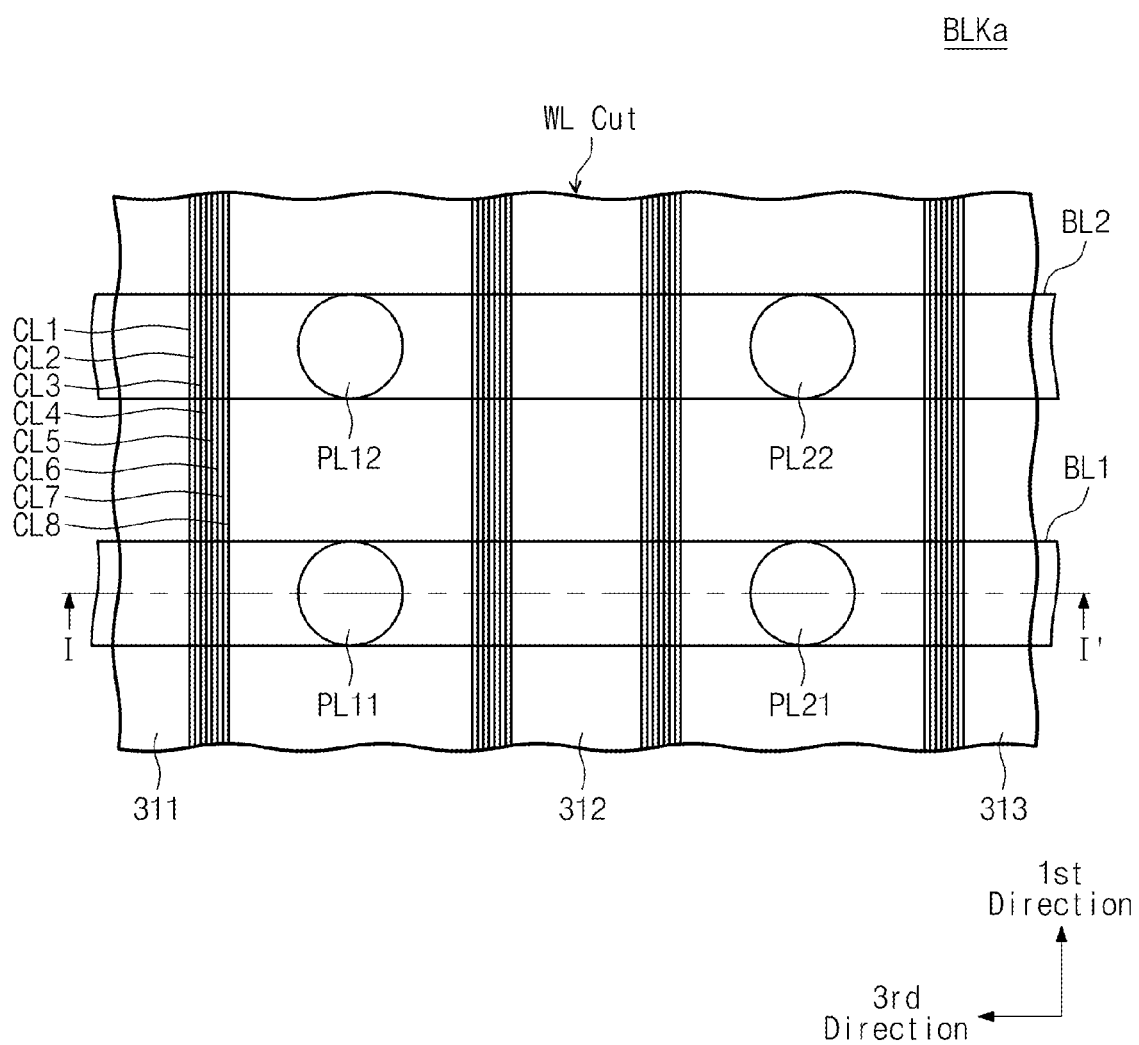
FIG. 3 is a plan view of a basic form of a memory block of the memory cell array of the device of FIG. 1.
Figure 4:
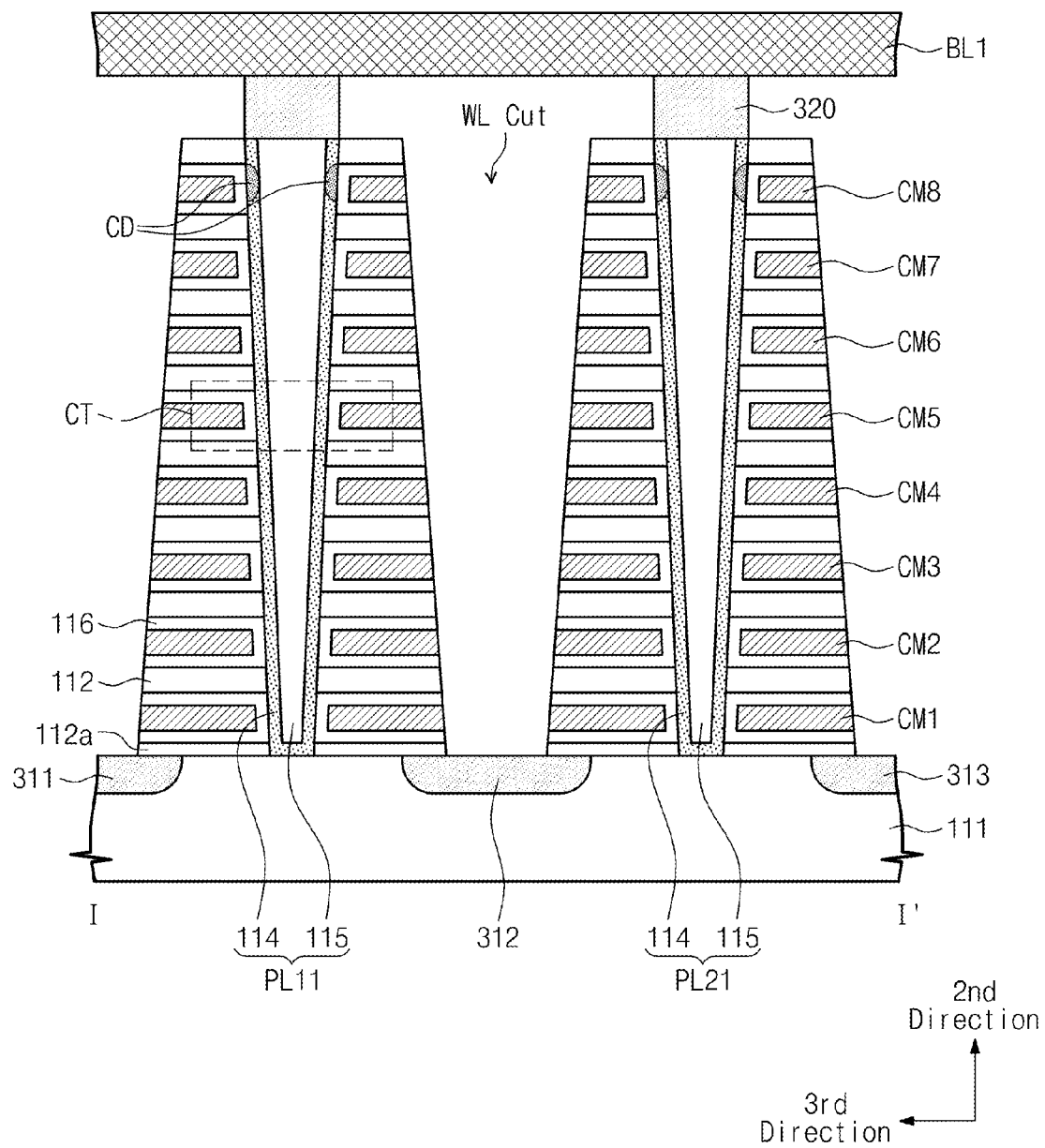
FIG. 4 is a cross-sectional view of a memory block of one embodiment of a nonvolatile memory device, according to the inventive concept, taken along line I-I' in FIG. 3.

Referring to FIGS. 3 and 4, each memory block BLKa includes a three-dimensional array of memory cells, as mentioned above, and a substrate 111 on which the array of memory cells is located.

More specifically, the memory cells may be disposed on a substrate 111 of a first conductivity type. To this end, a p-well may be formed by injecting elements from Group III of the periodic table, such as boron, into the substrate. The p-well may also be a pocket p-well provided within an n-well. The following description of the present embodiment will refer to the substrate 111 or region on which the memory cells are disposed as having a p-type of conductivity (e.g., will refer to the substrate 111 as having a p-well or pocket p-well). However, the inventive concept is not limited to a p-type of substrate 111.

The substrate 111 also has a plurality of doped regions each elongated in the first direction. The doped regions are spaced apart along the third direction. The doped regions, as illustrated in FIGS. 3 and 4, include first to third doped regions 311 to 313.

The first to third doped regions 311 to 313 have an n-type of conductivity in this example, i.e., a conductivity type different from that of the substrate 111. However, as was alluded to above, the first to third doped regions 311 to 313 are not limited to having an n-type of conductivity.

A stack of insulation layers 112 and 112a is provided on each region of the substrate 11 located between adjacent ones of the first to third doped regions 311 to 313. Thus, the insulation layers 112 and 112a of each stack are juxtaposed in the second direction (i.e., a direction perpendicular to the substrate 111). Each insulation layer 112 and 112a is of silicon oxide, for example. Furthermore, each insulation layer 112 and 112a may be elongated in the first direction. In an example of the present embodiment, one of the insulation layers, namely insulation layer 112a in the figures, contacts the substrate 111 and is thinner than the other insulation layers 112 in the stack.

The memory cell array also includes groups of pillars PL11, PL12 or PL21, PL22 each located between adjacent ones of the first to third doped regions 311 to 313, with the pillars of each group spaced from each other in the first direction, and extending in the second direction through the stack of insulation layers 112 and 112a located between the doped regions. The pillars PL11, PL12, PL21, and PL22 contact the substrate 111.

In the illustrated embodiment, the pillars PL11, PL12, PL21, and PL22 are each formed of a plurality of materials. For example, the pillars PL11, PL12, PL21, and PL22 are each formed of inner material 115 and a channel section 114 ("channel film" 114 hereinafter) surrounding the inner material 115. The channel film 114 comprises a semiconductor material (e.g., silicon) of the first conductivity type, i.e., of the same conductivity type as the substrate 111. The semiconductor material may be intrinsic or formed by doping. The inner material 115 is insulating material. For example, the inner material 115 may comprise silicon oxide. Alternatively, the inner material 115 may be air, such that a gap is formed inwardly of the channel film 114.

Information storage films 116 are each provided along upper and lower confronting surfaces of adjacent insulation layers 112, 112a in the stacks, and along an outer surfaces of the pillars PL11, PL12, PL21, and PL22 spanning the upper and lower surfaces. In the present embodiment, the thickness of each information storage film 116 is less than half the distance between adjacent ones of the insulation layers 112 and 112a in the stack thereof, i.e., insulations layers 112, 112a adjacent one another in the second direction. Furthermore, note, in this embodiment, there is no information storage film present on the upper surface of the uppermost insulation layer 112 or on the lower surface of the lowermost insulation layer 112a.

Conductive material layers CM1 to CM8 are disposed along surfaces of the information storage films 116. The conductive material layers CM1 to CM8 may be of metallic material or of a nonmetallic conductive material such as doped polysilicon. In this embodiment, the conductive material layers CM1 to CM8 are each elongated in the first direction. Furthermore, each of the conductive material layers CM1 to CM8 is interposed between part of an information storage film 116 extending along a lower surface of an upper insulation layer 112, 112a and part of the information storage film 116 extending along an upper surface of a lower insulation layer 112, 112a.

The adjacent groups (rows) of pillars PL11, PL12 and PL21, PL22, constituted by conductive material layers CM1 to CM8 and insulation layers 112 and 112a, are separated from each other by word line cuts (WL Cuts) on the doped region (312) therebetween.

Furthermore, upper portions of pillars PL11, PL12, PL21, and PL22 include channel doping areas CD, respectively. More specifically, the channel doping areas CD of this embodiment are constituted by portions of the channel films 114 located at the same level as the uppermost conductive material layer CM8. The channel doping areas CD are of a p-type of conductivity in this embodiment. In addition, the vertical sectional profiles of the channel doping areas CD may be semicircular. The semicircular profiles of the channel doping areas CD are an indication of their doping density, meaning that the concentration of the dopant increases downwardly in the second direction and then decreases. That is, the doping density of the channel doping areas CD may have a bell-shaped distribution as illustrated in FIG. 4.

Drains 320 are disposed on the pillars PL11, PL12, PL21, and PL22, respectively. The drains 320 are of a semiconductor material (e.g., silicon) having the second conductivity type (n-type in this example). The drains 320 extend over the upper portions of the channel films 114 of the pillars PL11, PL12, PL21, and PL22.

Bit lines BL1 and BL2 extending in the third direction are disposed on the drains 320 as spaced apart from one another in the first direction. In this embodiment, the drains 320 and the bit lines BL contact each other but the drains 320 and the bit lines BL may be connected via contact plugs (not shown). The bit lines BL may be of a metallic conductive material or a nonmetallic conductive material such as doped polysilicon.

As mentioned above, the memory block BLKa has rows and columns of pillars PL11, PL12, PL21, and PL22. In this respect, the pillars PL11 and PL12 connected via the conductive material layers CM1 to CM8 and the information storage films 116 provided between the first and second doping regions 311 and 312 may constitute a first row of pillars, and pillars PL21 and PL22 connected via the conductive material layers CM1 to CM8 and the information storage films 116 provided between the second and third doping regions 312 and 313 may constitute a second row of pillars. Thus, a column of the pillars PL11, PL12, PL21, and PL22 is constituted by the pillars disposed along each of the bit lines BL1 and BL2. That is, the pillars PL11 and PL21 connected with the first bit line BL1 via a drain 320 may constitute a first column of pillars, and the pillars PL12 and PL22 connected with the second bit line BL2 via a drain 320 may constitute a second column of pillars.

Furthermore, each of the pillars PL11, PL12, PL21, and PL22 and its associated information storage films 116 and conductive material layers CM1 to CM8 constitute a cell string. Each of the cell strings thus has a plurality of cell transistors CT stacked in a direction perpendicular to the substrate 111 (i.e., the second direction in the figure). The cell transistors CT will be more fully described with reference to FIG. 5.

Figure 5:
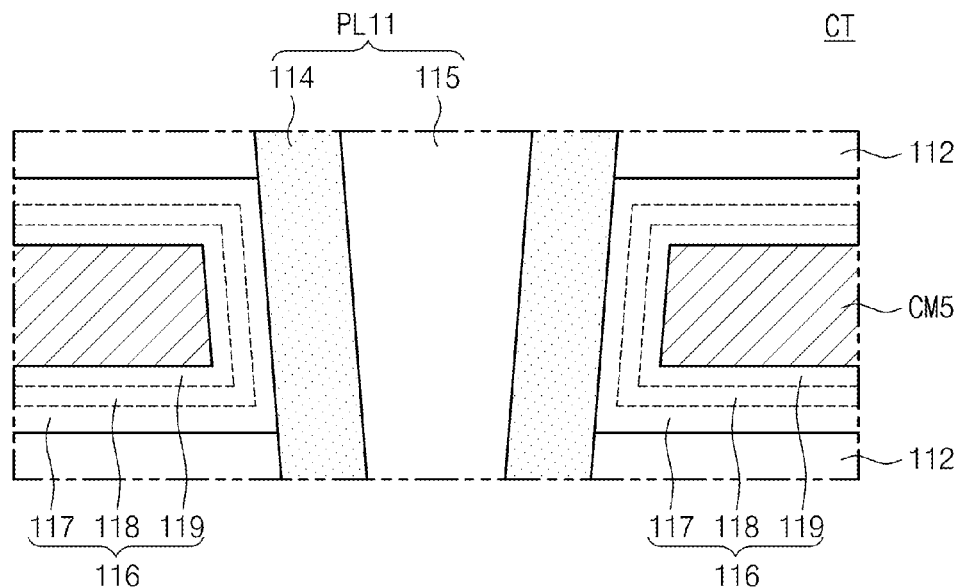
FIG. 5 is an enlarged view of one of the cell transistors CT shown in FIG. 4.

FIG. 5 illustrates the fifth cell transistor CT above the substrate 111 constituted by pillar PL11 of a first row and a first column. More specifically, referring to FIGS. 3 to 5, the fifth cell transistor CT is constituted by fifth conductive material layer CM5, a part of a pillar PL11 adjacent to the fifth conductive material layer CM5, and the information storage film 116 provided between the fifth conductive material layer CM5 and the pillar PL11.

In the cell transistors CT, the channel films 114 of the pillars PL11, PL12, PL21, and PL22 may include the same p-type conductivity (formed using silicon) as the substrate 111. The channel films 114 thus serve as the bodies of cell transistors CT. Thus, the channel films 114 of the pillars PL11, PL12, PL21, and PL22 are used to provide vertical channels.

In addition, each of the information storage films 116 of this embodiment includes first to third sub insulation films 117, 118, and 119. The first sub insulation films 117 adjacent to the pillars PL11, PL12, PL21, and PL22 serve as tunneling insulation films of the cell transistors CT. To this end, the first sub insulation film 117 may be of a thermal oxide. In particular, the first sub insulation films 117 may be a silicon oxide film.

The second sub insulation films 118 act as charge storage films of the cell transistors CT. For example, the second sub insulation films 118 may act as a charge trap film, respectively. To this end, the second sub insulation films 118 may be a nitride film (e.g., a silicon nitride film) or a metal oxide film (e.g., an aluminum oxide film or a hafnium oxide film). Accordingly, each cell transistor CT may be a charge trap type of cell transistor.

The third sub insulation films 119 adjacent to the conductive material layers CM1 to CM8 act as blocking insulation films of the cell transistors CT. In this respect, the third sub insulation film 119 may be formed of a single layer or multiple layers. Preferably, the third sub insulation film 119 is a dielectric film (e.g., an aluminum oxide film or a hafnium oxide film) whose dielectric constant is larger than those of the first and second sub insulation films 117 and 118. For example, the third sub insulation film 119 is a silicon oxide film.

In this embodiment, the first to third sub insulation films 117 to 119 are constituted by an ONO (oxide-nitride-oxide) layer.

The conductive material layers CM1 to CM8 constitute conductive lines interconnecting the pillars PL11 and PL12 or PL21 and PL22 in the same row. The conductive material layers CM1 to CM8 act as gates (or control gates) of the cell transistors CT.

Furthermore, the cell transistors CT of each cell string can be used for different purposes. For example, among the cell transistors CT of a cell string, at least one of the upper cell transistors CT may be used as a string selection transistor, at least one of the lower cell transistors may be used as a ground selection transistor, and each of the remaining cell transistors may be used as a memory cell or a dummy memory cell. In this case, each of the conductive material layers CM1 to CM8 may be used as a string selection line, a ground selection line, a word line, or a dummy word line.

Figure 6:
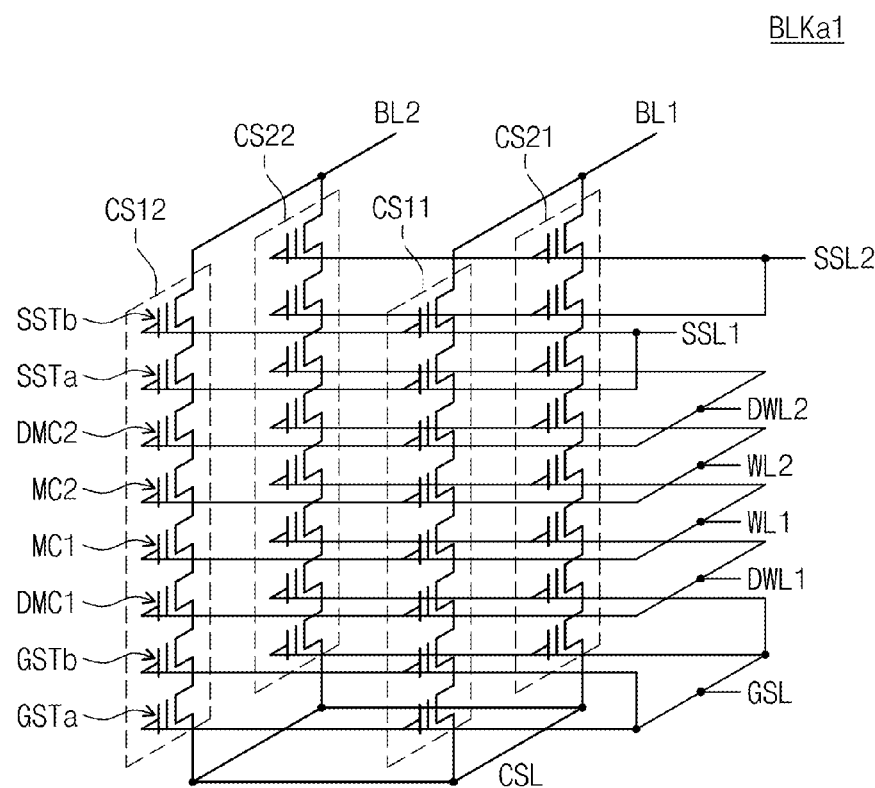
FIG. 6 is a circuit diagram illustrating an equivalent circuit of the memory block shown in FIGS. 3 to 5.

FIG. 6 illustrates an equivalent circuit of the memory block shown in and described with reference to FIGS. 3 to 5.

Referring to FIGS. 3 to 6, cell strings CS11 and CS21 are connected between a first bit line BL1 and a common source line CSL, and cell strings CS12 and CS22 are connected between a second bit line BL2 and the common source line CSL. The cell strings CS11, CS21, CS12, and CS22 are constituted by pillars PL11, PL21, PL12, and PL22, respectively.

More specifically, the pillar PL11 with conductive material layers CM1 to CM8 and information storage films 116 form the cell string CS11 of a first row and a first column. The pillar PL12 with the conductive material layers CM1 to CM8 and information storage films 116 form the cell string CS12 of the first row and the second column. The pillar PL21 with the conductive material layers CM1 to CM8 and information storage films 116 form the cell string CS21 of the second row and the first column. The pillar PL22 with the conductive material layers CM1 to CM8 and information storage films 116 form the cell string CS22 of the second row and the second column.

In the cell strings CS11, CS21, CS12, and CS22, the first and second cell transistors (from the ground up) serve as ground selection transistors GSTa and GSTb. The ground selection transistors GSTa and GSTb are connected in common with a ground selection line GSL. In the illustrated embodiment, the first and second conductive material layers CM1 and CM2 are interconnected to form the ground selection line GSL. Alternatively, the ground selection transistors GSTa at one level and the ground selection transistors GSTb at a level above that of the ground selection transistors GSTa may be connected with different ground selection lines, respectively.

In the cell strings CS11, CS21, CS12, and CS22, the third level of cell transistors act as first dummy memory cells DMC1. The first dummy memory cells DMC1 are connected with a first dummy word line DWL1. In the illustrated embodiment, the third layer of conductive material CM3 is contiguous to form the first dummy word line DWL1.

In the cell strings CS11, CS21, CS12, and CS22, the fourth and fifth level of cell transistors serve as first and second memory cells MC1 and MC2. The first and second memory cells MC1 and MC2 are connected with first and second word lines WL1 and WL2, respectively. That is, the memory cells at the same level share a word line. In the illustrated embodiment, the fourth layer of conductive material CM4 is contiguous to form the first word line WL1, and the fifth layer of conductive material CM5 is contiguous to form the second word line WL2.

In the cell strings CS11, CS21, CS12, and CS22, the sixth level of cell transistors acts as second dummy memory cells DMC2. The second dummy memory cells DMC2 are connected with a second dummy word line DWL2. In the illustrated embodiment, the sixth layer of conductive material CM6 is contiguous to form the second dummy word line DWL2.

In the cell strings CS11, CS21, CS12, and CS22, the seventh and eighth levels of cell transistors act as string selection transistors SSTa and SSTb. The string selection transistors SSTa and SSTb in the same row are connected with first and second string selection lines SSL1 and SSL2, respectively. Thus, the cell strings of the same row (e.g., CS11 and CS12) share a string selection line (SSL1), and cell strings of different rows (e.g., CS11 and CS21) are connected with different string selection lines (SSL1 and SSL2).

The first and second string selection lines SSL1 and SSL2 may be formed by the seventh and eighth layers of conductive material CM7 and CM8, respectively.

Also, in the illustrated embodiment, a common source line CSL is connected in common with the cell strings CS11, CS21, CS12, and CS22. For example, the first to third doping regions 311 to 313 may be interconnected to form the common source line CSL.

As illustrated in FIG. 6, memory cells disposed at the same level or dummy memory cells disposed at the same level are connected in common with a respective word line. Accordingly, when a word line is selected, all cell strings CS11, CS21, CS12, and CS22 are selected.

On the other hand, cell strings of different rows are connected with different string selection lines. Accordingly, a row of cell strings CS11 and CS12 or CS21 and CS22 may be electrically isolated from the bit lines BL1 and BL2 (unselected), or a row of cell strings CS21 and CS22 or CS11 and CS12 may be electrically connected with the bit lines BL1 and BL2 (selected), using the first and second string selection lines SSL1 and SSL2. A columns of cell strings may be selected using the bit lines BL1 and BL2.

Note, the memory block BLKa shown in described with reference to FIGS. 3-5 may be adapted, using the layers of conductive material, to form equivalent circuits other than that shown in FIG. 6. For instance, the lower ground selection transistors GSTa and the upper ground selection transistors GSTb may be connected with different ground selection lines. That is, the ground selection transistors at each level may be connected with a respective ground selection line.

Likewise, the lower string selection transistors SSTa and the upper string selection transistors SSTb may be connected with different string selection lines. That is, the string selection transistors at each level may be connected with a respective string selection line.

Referring once again to the embodiment of FIGS. 3 to 6, the channel doping areas CD are provided at those parts of the channel films 114 corresponding to the upper string selection transistors SSTb. Accordingly, threshold voltages of the upper string selection transistors SSTb may be higher than those of the lower string selection transistors SSTa.

Figure 7:
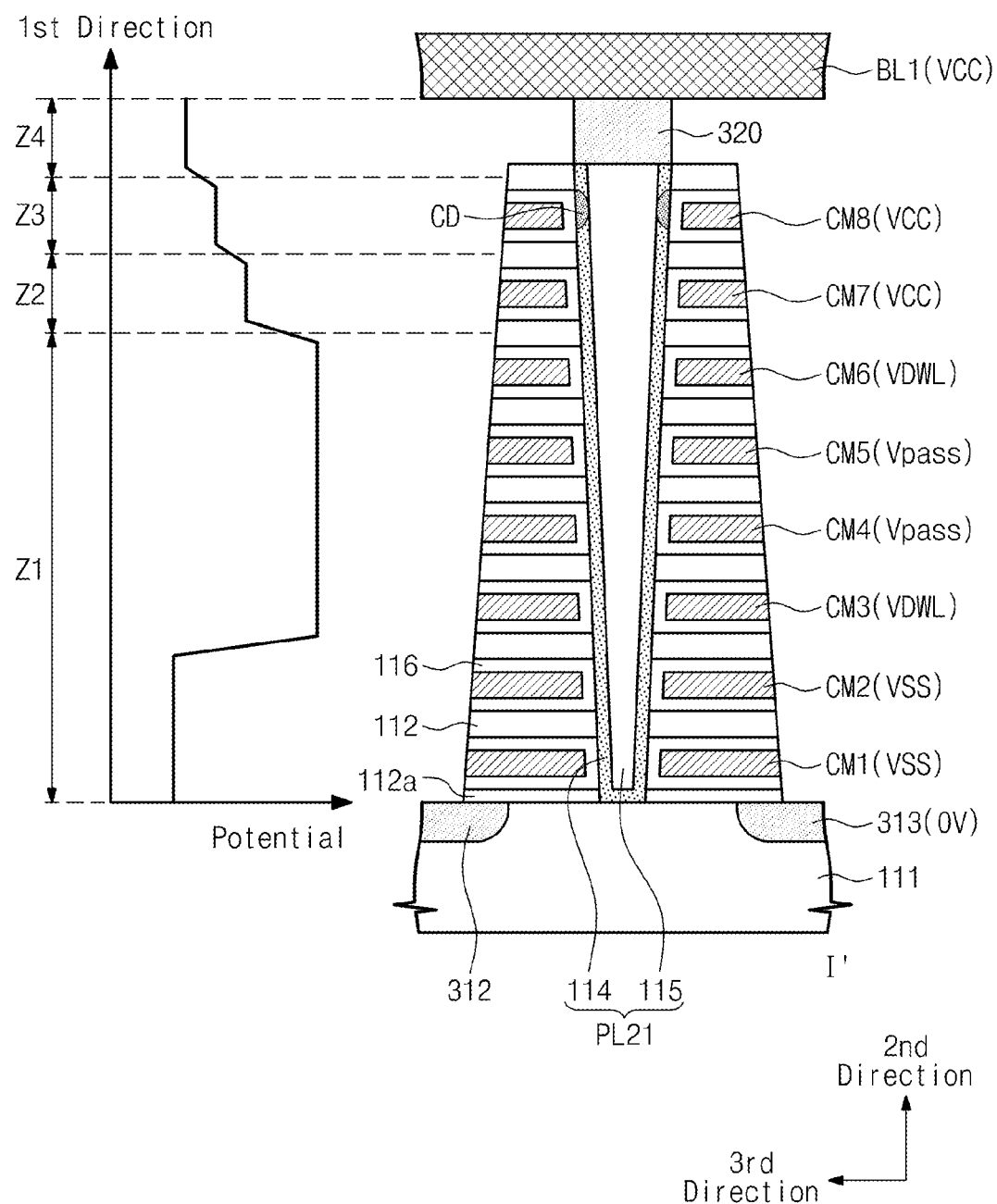
FIG. 7 is a diagram illustrating a bias condition and potential of a program-inhibited cell string of the memory block shown in FIGS. 3 to 5.

FIG. 7 illustrates a bias condition and potential of a program-inhibited cell string. In this example it is the cell string CS21 that is program inhibited.

Referring to FIGS. 6 and 7, a ground voltage VSS is supplied to a ground selection line GSL. That is, ground selection transistors GSTa and GSTb are turned off. A dummy word line voltage VDWL1 is supplied to dummy word lines DWL1 and DWL2. The dummy word line voltage VDWL1 may be a high voltage. A pass voltage Vpass is supplied to word lines WL1 and WL2. The pass voltage Vpass may also be a high voltage. A power supply voltage VCC is supplied to string selection lines SSL1 and SSL2.

The voltage of the portion of a channel film 114 corresponding to the word lines WL1 and WL2 and the dummy word lines DWL1 and DWL2 is boosted by the pass voltage Vpass and the dummy word line voltage VDWL. For example, the voltage of the portion of a channel film 114 corresponding to the word lines WL1 and WL2 and the dummy word lines DWL1 and DWL2 may be a high voltage. Accordingly, a first portion Z1 of the channel film 114 corresponding to the word lines WL1 and WL2 and the dummy word lines DWL1 and DWL2 may have a high potential.

The power supply voltage is applied to string selection lines SSL1 and SSL2. A lower string selection transistor SSTa may be turned off virtually. Accordingly, the potential of a second portion Z2 of the channel film 114 corresponding to the lower string selection transistor SSTa may be lower than that of the first portion Z1.

An upper string selection transistor SSTb may be turned off virtually. A threshold voltage of the upper string selection transistor SSTb may be lower than that of the lower string selection transistor SSTa. Accordingly, a potential of a third portion Z3 of the channel film 114 corresponding to the upper string selection transistor SSTb may be lower than that of the second portion Z2.

The power supply voltage VCC is supplied to a bit line BL1. In the program-inhibited cell string CS21, the power supply voltage VCC may be supplied to the upper string selection transistor SSTb. The upper string selection transistor SSTb may be turned off virtually (or, may be shut off) because potential of the channel film 114 is increased by the pass voltage Vpass. Accordingly, a potential of a fourth portion including the bit line BL1 and a drain 320 may be lower than that of the third portion Z3 of the channel film 114.

That is, a potential of the first portion (or zone) Z1, a potential of the second portion Z2 corresponding to the lower string selection transistor SSTa, a potential of the third portion Z3 corresponding to the upper string selection transistor SSTb, and a potential of the fourth portion Z4 corresponding to the bit line BL1 and the drain 320 may be differentiated along the second direction. Specifically, there is a stepwise decrease between the potential of the second portion Z2, corresponding to the lower string selection transistors SSTa, and the potential of the third portion Z3 corresponding to the upper string selection transistors SSTb.

Since a stepwise decrease in potentials occurs between the fourth portion Z4 corresponding to the bit line BL1 and the first portion Z1 whose potential is being boosted, leakage current due to a potential difference between the first portion Z1 and the fourth portion Z4 is lower than if there were a straight drop in potential between the fourth portion Z4 and the first portion Z1. Accordingly, the reliability of a nonvolatile memory device 100 is enhanced.

Although such an advantage may be provided by using two levels of string selection transistors formed by two layers of conductive material CM, respectively, as described above in the example of FIGS. 6 and 7, the inventive concept is not so limited. Rather, more than two layers of conductive materials, more than two levels of string selection transistors, may be provided.

Figure 8:
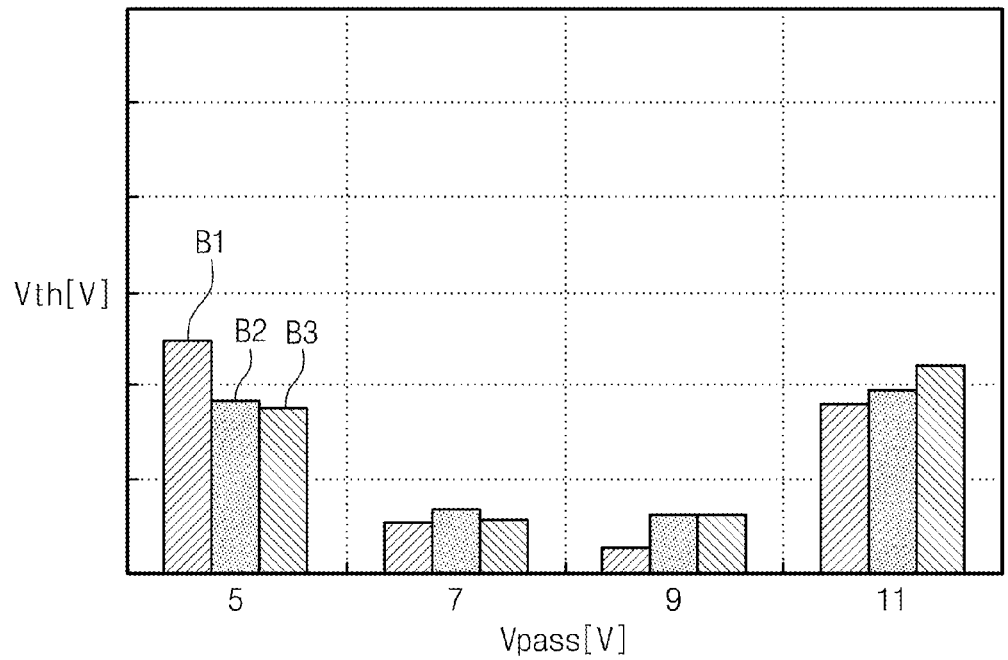
FIG. 8 is a bar graph of results of simulations run on various cell strings showing the threshold voltages of the memory cells of the cell strings under different pass voltages.

FIG. 8 is a bar graph illustrating results of simulations of program-inhibited cell strings of various memory blocks. In FIG. 8, the pass voltage Vpass of the program-inhibited cell string is indicated along the horizontal axis, and the vertical axis indicates threshold voltage Vth of the memory cells of the program-inhibited cell string.

Also, in FIG. 8, the first bars B1 indicate threshold voltages of memory cells of a cell string in which a threshold voltage of a lower string selection transistor SSTa is 0.7V and a threshold voltage of an upper string selection transistor SSTb is 1.4V, as provided for using a channel doping area CD according to the inventive concept. The second bars B2 indicate threshold voltages of memory cells of a cell string in which a threshold voltage of the lower string selection transistor SSTa is 1.4V and a threshold voltage of the upper string selection transistor SSTb is 0.7V. The third bars B3 indicate threshold voltages of memory cells of a cell string in which a threshold voltage of the lower string selection transistor SSTa is 1.2V and a threshold voltage of the upper string selection transistor SSTb is 1.2V.

As can be seen in FIG. 8, when the pass voltage Vpass is 7V, 9V, and 11V, the threshold voltages of the memory cells of the cell string are lower in each case in which the threshold voltage of a lower string selection transistor SSTa is lower than the threshold voltage of an upper string selection transistor SSTb, than in each case in which the threshold voltage of a lower string selection transistor SSTa is equal to or greater than the threshold voltage of an upper string selection transistor SSTb. That is, FIG. 8 shows that the program disturbance (increased threshold voltages of program-inhibited memory cells) can be reduced when a threshold voltage of the lower string selection transistor SSTa is lower than that of the upper string selection transistor SSTb due to a channel doping area CD.

Figure 9:
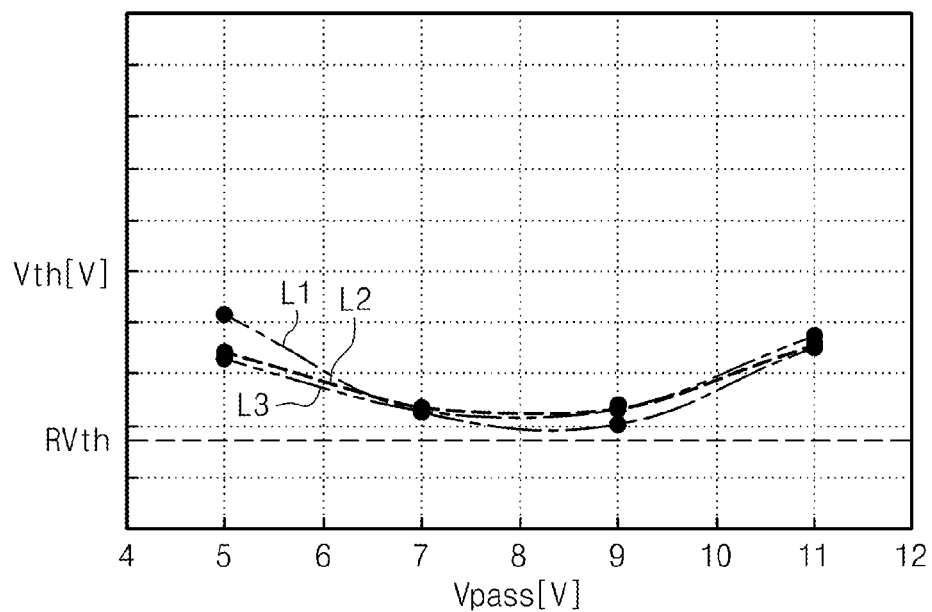
FIG. 9 is a line graph of the same results.

FIG. 9 is also a graph of the results of the simulations but one in which the result are plotted. In FIG. 9, 'RVth' indicates a reference threshold voltage of an erased memory cell. That is, erased memory cells have a threshold voltage lower than the reference threshold voltage RVth.

The first plot L1 indicates threshold voltages of memory cells of the cell string in which the threshold voltage of a lower string selection transistor SSTa is 0.7V and the threshold voltage of an upper string selection transistor SSTb is 1.4V. The second plot L2 indicates threshold voltages of memory cells of the cell string in which the threshold voltage of the lower string selection transistor SSTa is 1.4V and the threshold voltage of the upper string selection transistor SSTb is 0.7V. The third plot L3 indicates threshold voltages of memory cells of the cell string in which the threshold voltage of the lower string selection transistor SSTa is 1.2V and the threshold voltage of the upper string selection transistor SSTb is 1.2V.

As can be seen in FIG. 9, when the pass voltage Vpass is over 7V, the value of the threshold voltage Vth of the first plot L1 becomes lower than those of the second and third plots L2 and L3. Thus, FIG. 9 also shows that program disturbance is inhibited when a threshold voltage of the lower string selection transistor SSTa is lower than that of the upper string selection transistor SSTb, which can be provided by using the channel doping area CD according to the inventive concept.

Figure 10:
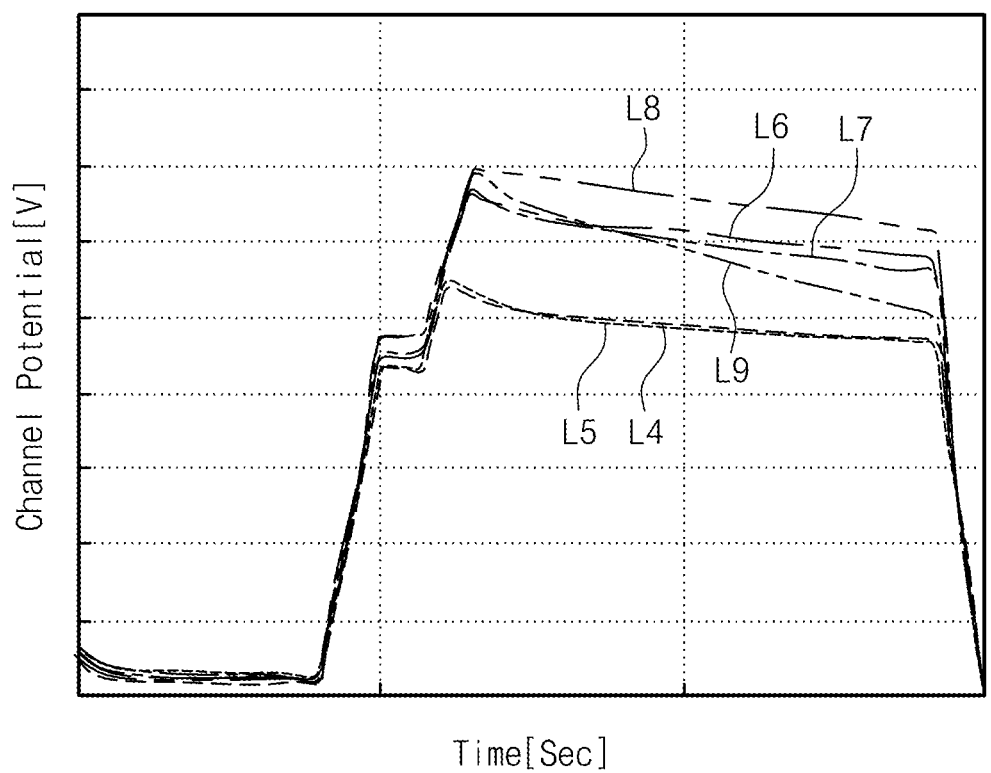
FIG. 10 is a graph of results of simulations of program-inhibited cell strings of various memory blocks showing the potentials of the channel films of the cell strings.

FIG. 10 is still another graph of results of simulations of program-inhibited cell strings of various memory blocks. In FIG. 10, time is plotted along the horizontal axis, and the values of potentials of the channel films 114 of the memory cells of the cell string are plotted along the vertical axis.

Referring to FIGS. 6 to 10, the fourth plot L4 shows the channel potentials in the case of a cell string in which a threshold voltage of a lower string selection transistor SSTa is higher than that of an upper string selection transistor SSTb and a voltage of 3V is supplied to a second dummy word line DWL2. The plot L5 shows a channel potential of a corresponding cell string in which a threshold voltage of the lower string selection transistor SSTa is lower than that of the upper string selection transistor SSTb and a voltage of 3V is supplied to the second dummy word line DWL2.

The values of the channel potential V that make up the fourth plot L4 are generally lower than those that make up the fifth plot L5.

The sixth plot L6 shows a channel potential of a cell string in which a threshold voltage of the lower string selection transistor SSTa is higher than that of the upper string selection transistor SSTb and a voltage of 6V is supplied to the second dummy word line DWL2. The seventh plot L7 shows a channel potential of a corresponding cell string in which a threshold voltage of the lower string selection transistor SSTa is lower than that of the upper string selection transistor SSTb and a voltage of 6V is supplied to the second dummy word line DWL2.

The values of the channel potential V that make up the sixth plot L6 are generally lower than those that make up the seventh line L7.

The eighth plot L8 shows a channel potential of a cell string in which a threshold voltage of the lower string selection transistor SSTa is higher than that of the upper string selection transistor SSTb and a voltage of 11V is supplied to the second dummy word line DWL2. The ninth plot L9 shows a channel potential of a corresponding cell string but in which a threshold voltage of the lower string selection transistor SSTa is lower than that of the upper string selection transistor SSTb and a voltage of 11V is supplied to the second dummy word line DWL2.

The values of the channel potential V that make up the eighth plot L8 are generally lower than those that that make up the ninth line L9.

Each of these pairs of plots L4 and L5, L6 and L7 and L8 and L9 shows that the channel potential is higher when a threshold voltage of the lower string selection transistor SSTa is lower than that of the upper string selection transistor SSTb. In an example according to the inventive concept, the channel potential may be increased by boosting a channel to decrease gate induced drain leakage.

Furthermore, as the voltage supplied to the second dummy word line DWL2 increases, the channel potential increases due to the provision of the channel doping area CD. That is, as the voltage supplied to the second dummy word line DWL2 increases, the amount of gate induced drain leakage that can be inhibited by the channel doping area CD increases. Accordingly, the window of voltages that may be applied to the second dummy word line DWL2 may be rather wide.

A method according to the inventive concept of forming a memory block, of the type shown in and described with reference to FIGS. 3-5, will now be described with reference to FIGS. 11 to 17. Thus, reference may be made to the description of FIGS. 3-5 for some of the elements/features referred to in the description that follows as well as certain structural aspects thereof which will not be described again for the sake of brevity.

Figure 11:
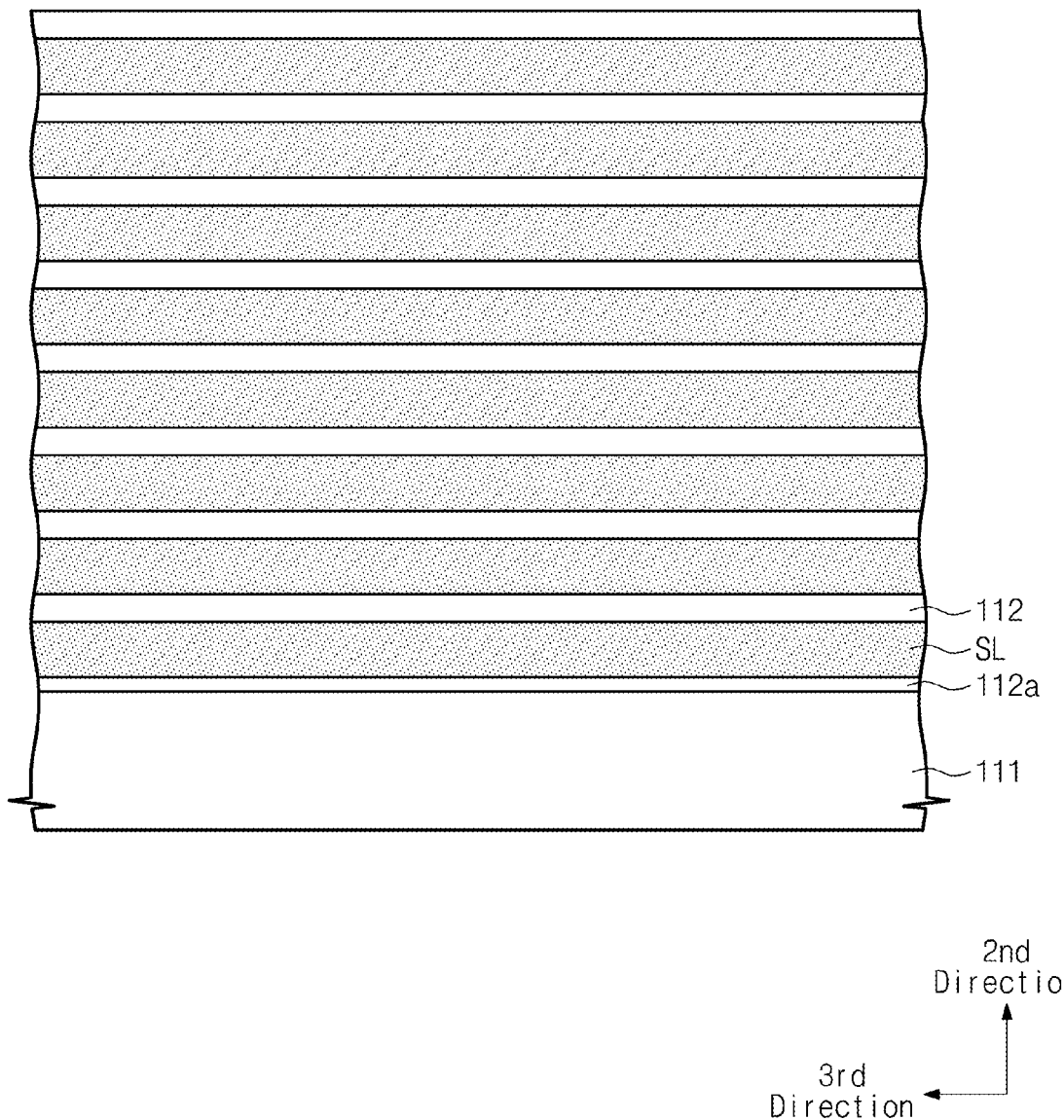
FIGS. 11 to 17 are sectional views, respectively, and together illustrate a method of fabricating the memory block shown in FIGS. 3 to 5.

Referring to FIG. 11, insulation layers 112 and 112a and sacrificial films SL are formed sequentially on a substrate 111. The lowermost insulation layer 112a may be thinner than those of other insulation layers. In this embodiment, the insulation layers 112 and 112a are formed of silicon oxide, and the sacrificial films 112 are formed of silicon nitride.

Figure 12:
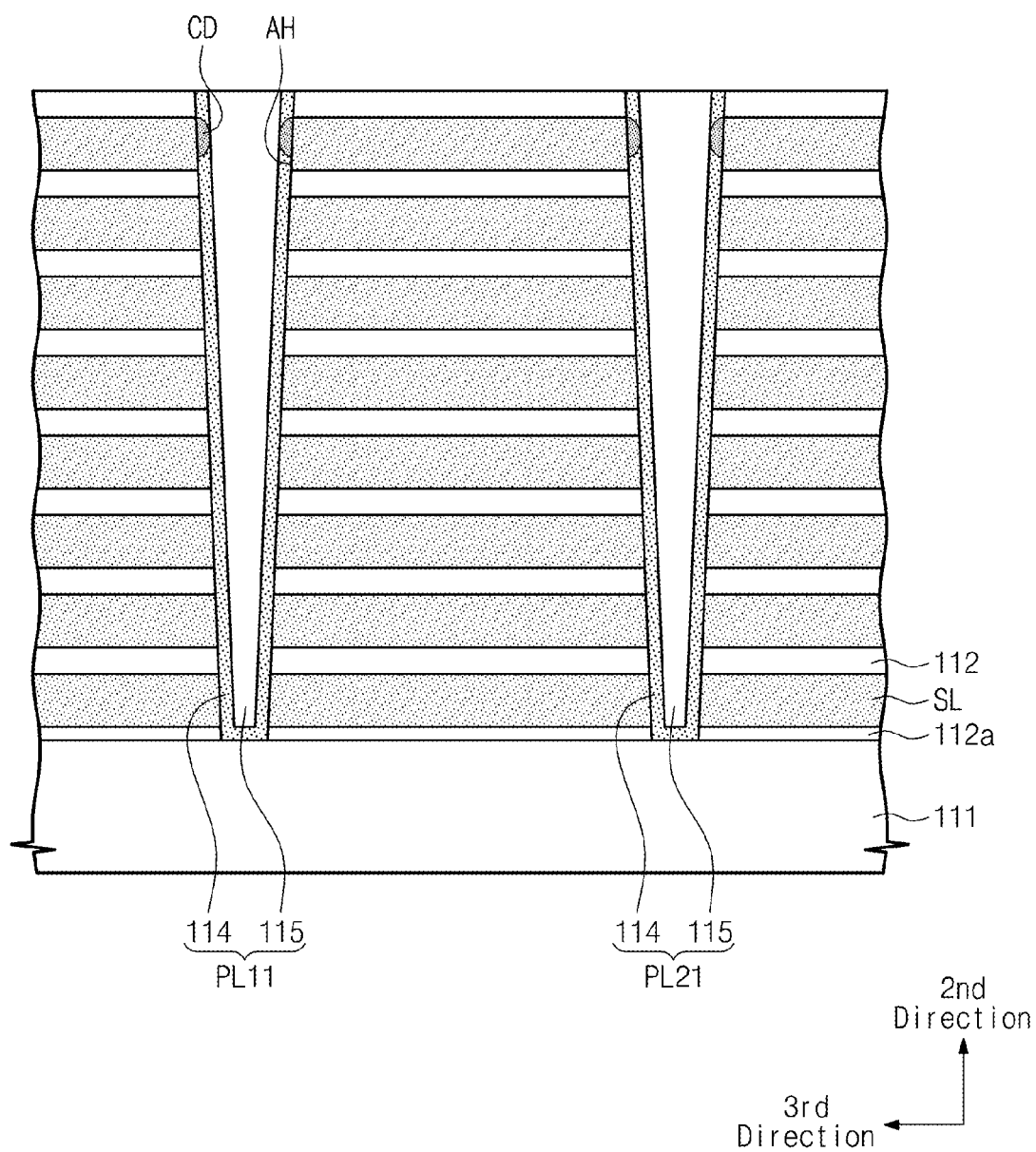

Referring to FIG. 12, active holes AH are formed through the first and second insulation layers 112 and 112a in a direction perpendicular to the substrate 111. The active holes AH may expose the substrate 111.

Channel films 114 are formed on inner surfaces of the active holes AH, respectively. The channel films 114 may be of intrinsic semiconductor material. The channel films 114 may be of silicon. Inner material is then formed on each of the channel films 114. The inner material may be a semiconductor oxide or semiconductor nitride. Alternatively, the spaces inside the channel films 114 may be left empty so that air gaps are formed. In either case, the medium 115 within the spaces delimited by the channel films 114 has an insulating property. Each channel film 114 and the insulating medium 115 within any active hole constitute a pillar. That is, the channel films 114 and the inner medium 115 constitute pillars PL11, PL12, PL21, and PL22.

Subsequently, channel doping areas CD are formed. For example, impurities are injected into portions of the channel films 114 such that a channel doping area CD is formed in each channel film 114 at a location corresponding to at least one of the upper sacrificial films. The impurities may be a Group III element such as boron.

Figure 13:
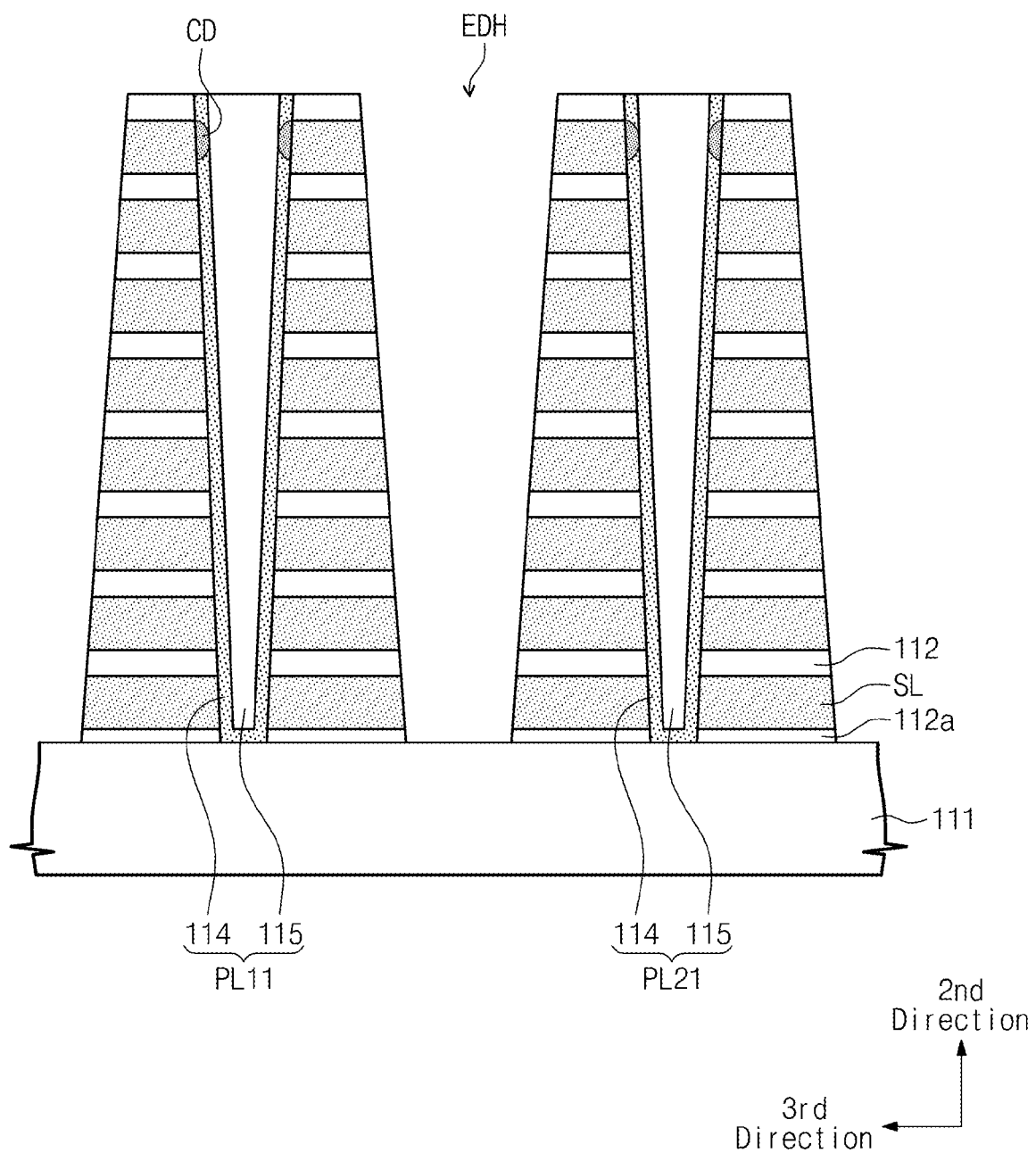

Referring to FIG. 13, electrode division holes EDH are formed through the stack of the insulation layers 112 and 112a and the sacrificial films SL in a direction perpendicular to the substrate 111 (the second direction in the figure). The electrode division holes EDH may be formed to expose the substrate 111. Also, the electrode division holes EDH may be formed as elongated in a first direction (into the sheet in the figure) so as to separate the pillars PL11, PL12 from the pillars PL21 and PL22 along a third direction.

Figure 14:
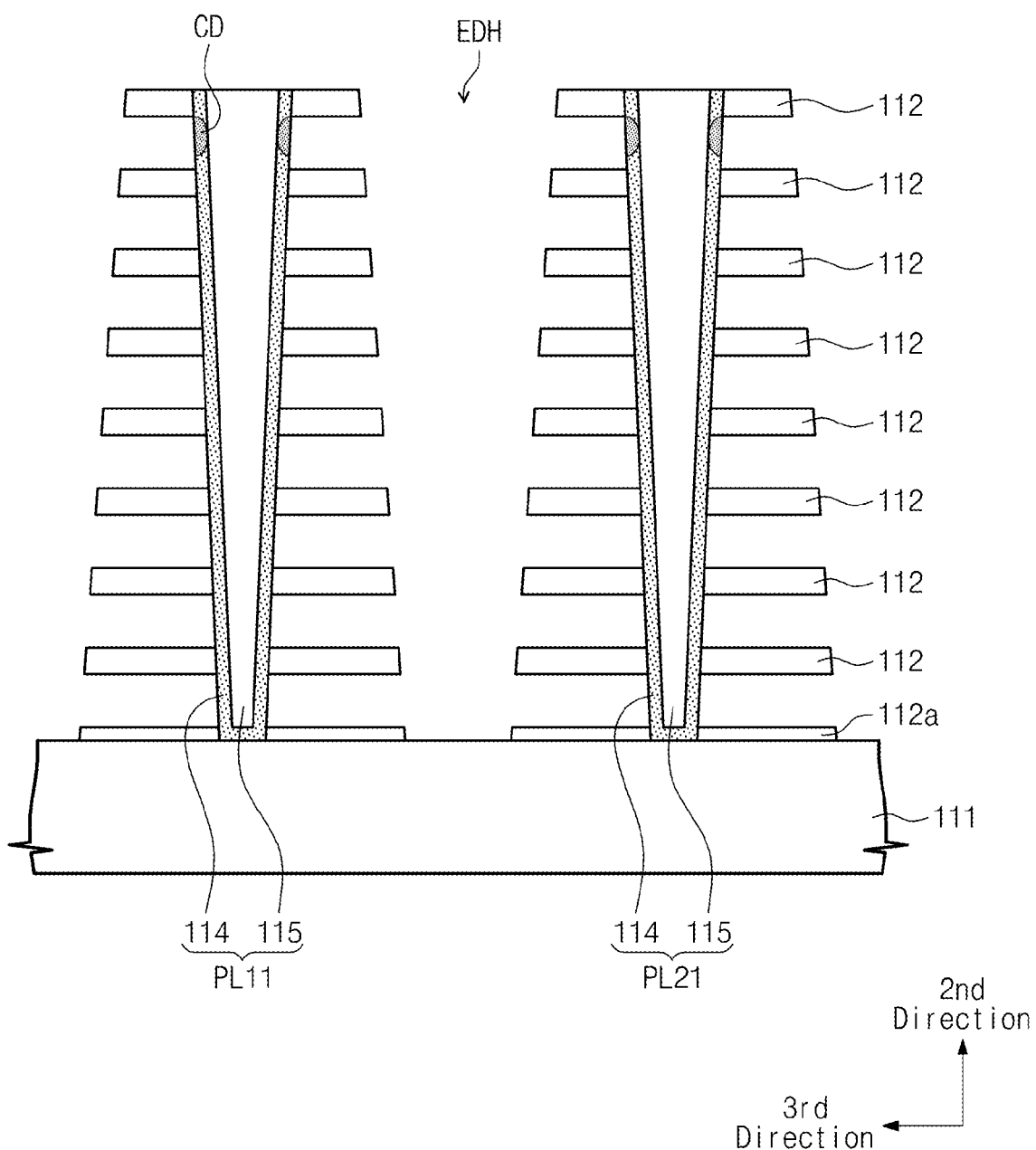

Referring to FIG. 14, the sacrificial films SL are selectively removed. For example, the sacrificial films SL are removed by dispensing an etchant into the electrode division holes EDH, wherein the etchant is effective to etch the sacrificial films SL at a significantly greater etching rate than the insulation layers 112 and 112a. As a result, an upper surface of the substrate 111, outer sides of the pillars PL11, PL12, PL21, and PL22, upper surfaces of the insulation layers 112, sides of the insulation layers 112 opposite the pillars PL11, PL12, PL21, and PL22, upper surfaces of the insulation layers 112a, and sides of the insulation layers 112a opposite the pillars PL11, PL12, PL21, and PL22 are exposed.

Figure 15:
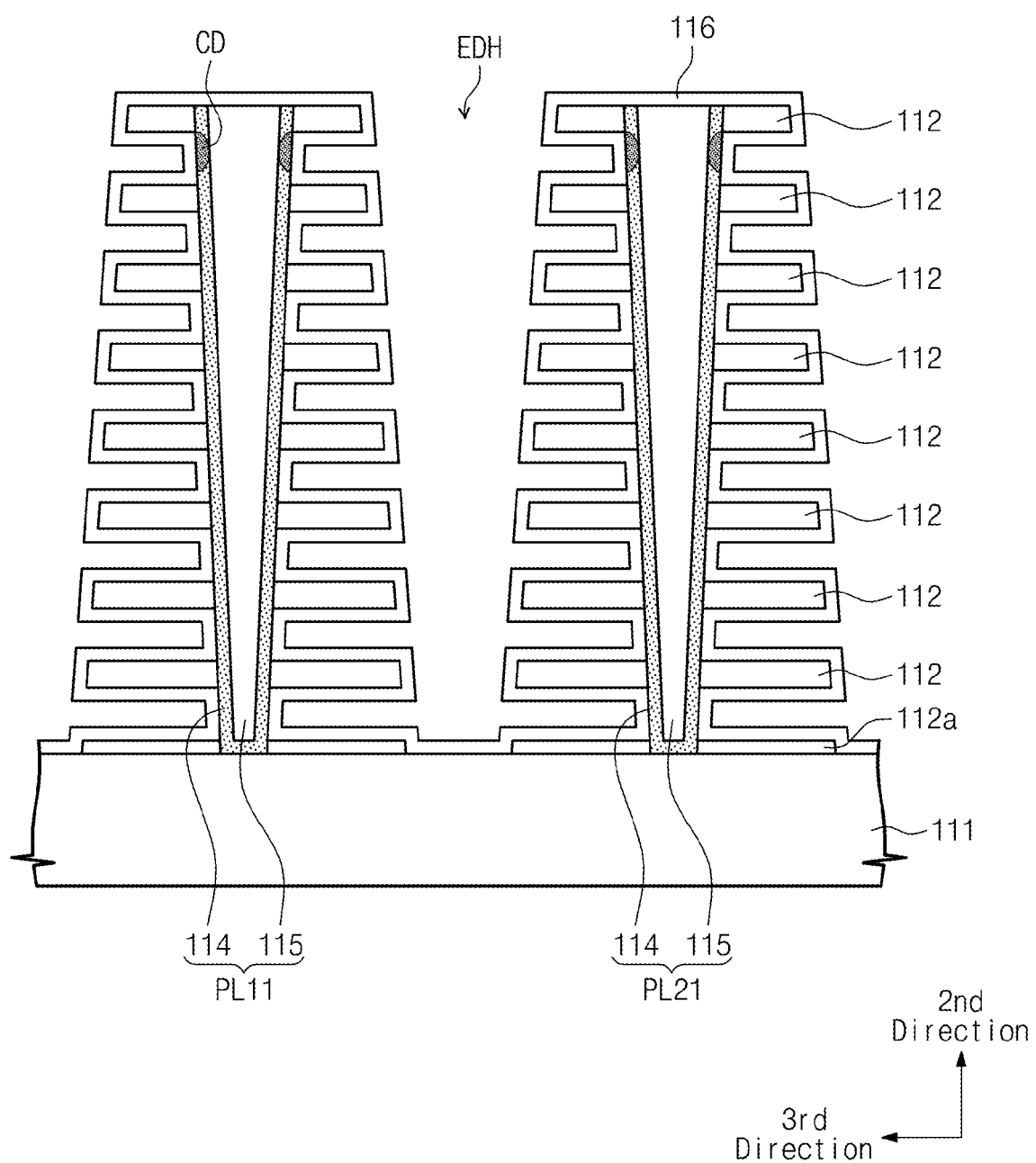

Referring to FIG. 15, information storage films 116 are conformally formed on exposed surfaces of the substrate 111, the insulation layers 112 and 112a, and the pillars PL11, PL12, PL21, and PL22.

Figure 16:
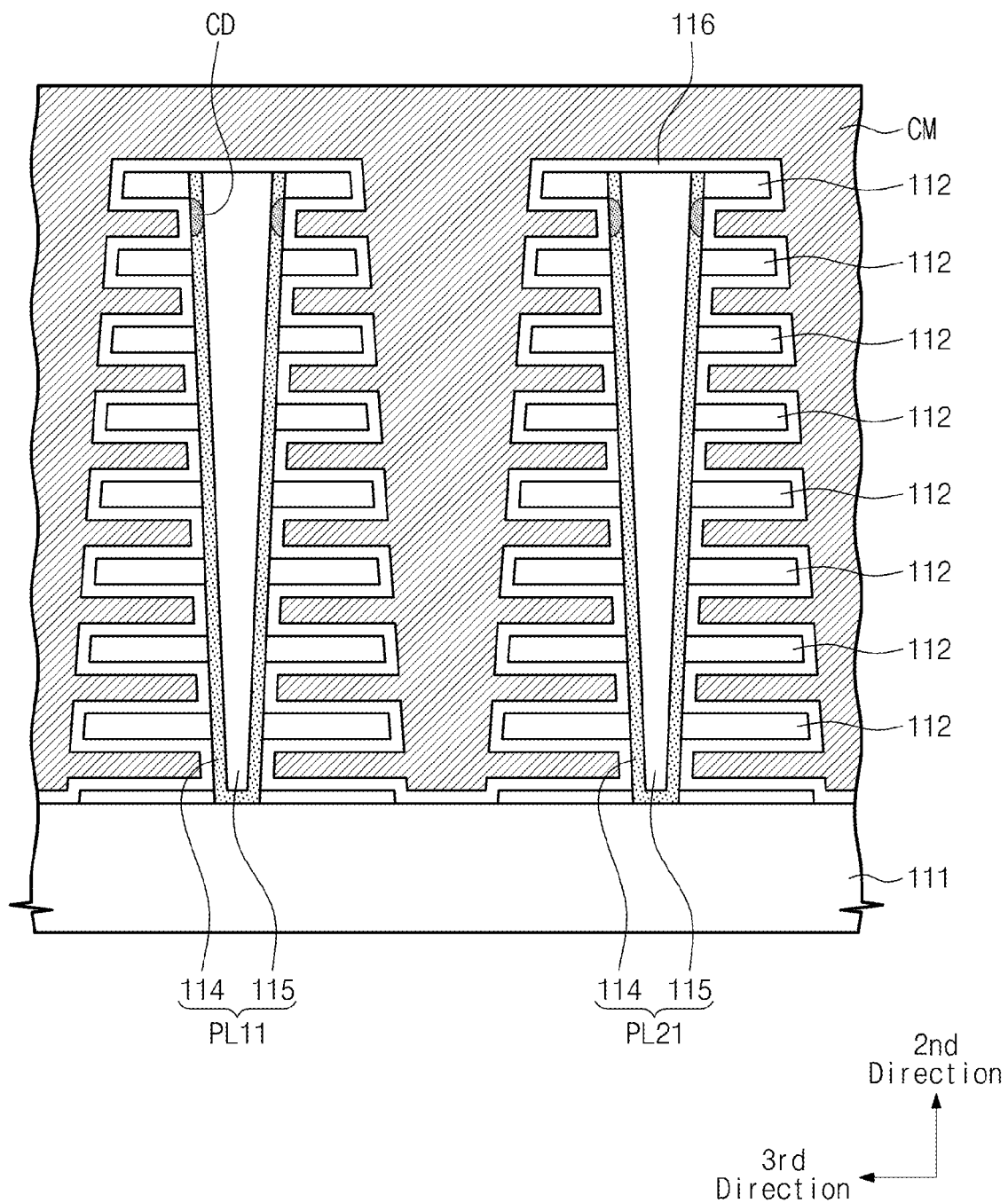

Referring to FIG. 16, a conductive film CM is formed on exposed surfaces of the information storage films 116. The conductive film CM is formed to such a thickness as to fill the electrode division holes EDH and gaps between the first insulation layers 112 covered by the information storage films 116.

Figure 17:
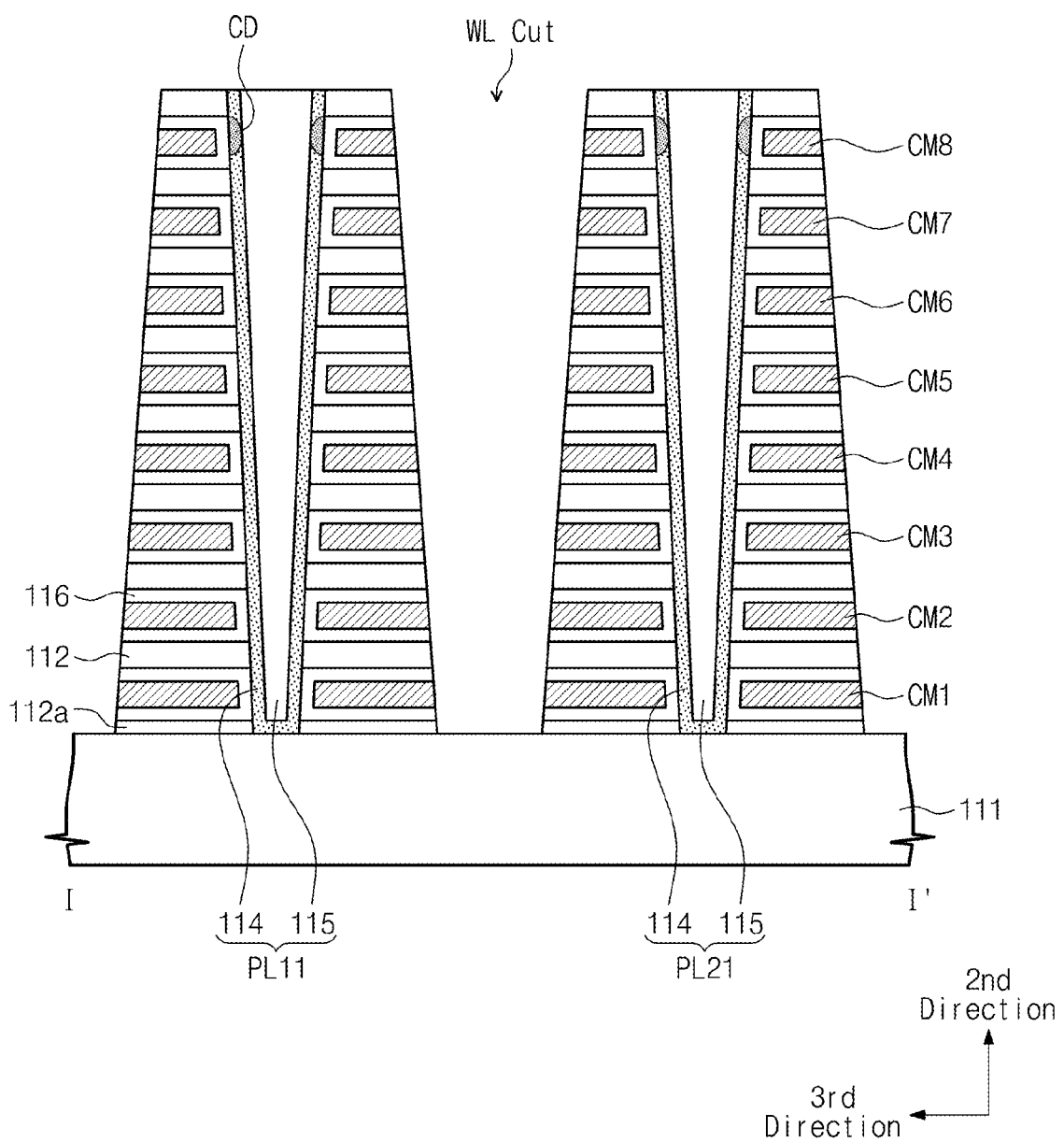

Referring to FIG. 17, the structure is planarized to remove conductive material CM and the information storage films 116 formed on an upper surface of the uppermost insulation layer 112, i.e., the structure is planarized until the uppermost insulation layer 112 is exposed. Then, the resulting structure is anisotropically etched in the second direction (i.e., the direction perpendicular to the substrate 111) to form a word line cut WL Cut at an area corresponding to the electrode division hole EDH (refer to FIG. 15).

As a result, the conductive material CM is separated into conductive material layers CM1 to CM8. Also, at this time, in addition to some of the conductive material CM, the portions of the information storage films on sides the first insulation layers 112 opposite the pillars PL11, PL12, PL21, and PL22 are removed Referring back to FIG. 4, doped regions 311 to 313 are formed by injecting elements into the substrate 111 via the word line cut WL Cut. In this example, the doped regions 311 to 313 have a conductivity of type different from that of the region of the substrate 111 in which they are formed and the same as that of the pillars PL11, PL12, PL21. The word line cut WL Cut may then be filled with insulation material.

Next, drains 320 are formed on the pillars PL11, PL12, PL21, and PL22. The drains 320 are formed of semiconductor material having a conductivity of type different from the channel films 114.

Bit lines BL1 and BL2 are then formed on the drains 320. The bit lines BL1 and BL2 are formed of a conductive material such as doped polysilicon, a metallic material, or the like.

In an example of the method described above, the channel doping areas CD are formed after the channel films 114 and inner material is formed in the spaces delimited inwardly by the channel films 114. However, the inventive concept is not limited thereto. The channel doping areas CD can be formed at any time the channel films 114 are exposed.

Figure 18:
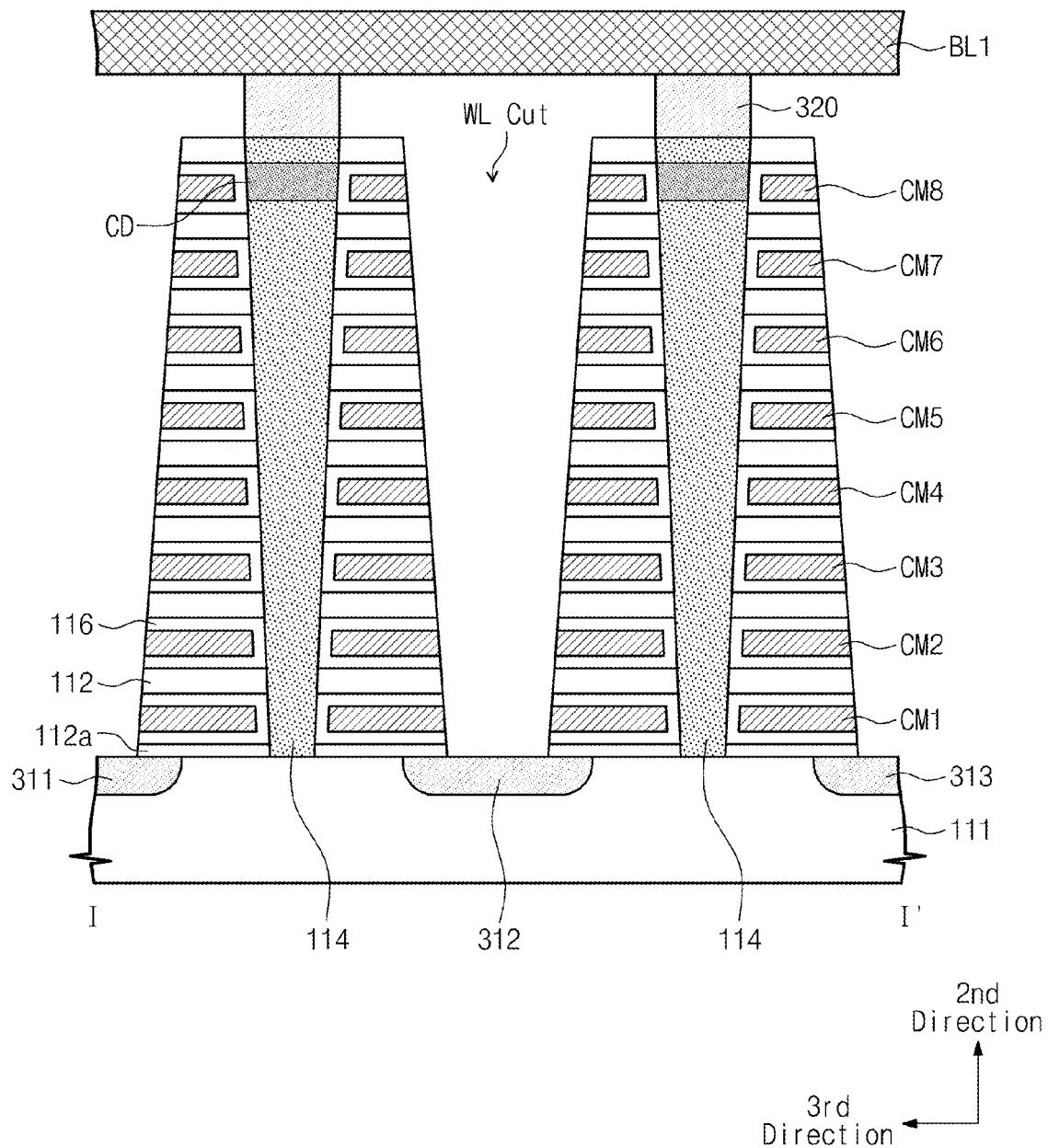
FIG. 18 is a cross-sectional view, taken along line I-I' of FIG. 3, of a memory block of another embodiment of a nonvolatile memory device according to the inventive concept.

FIG. 18 illustrates another embodiment of a memory block of a memory cell array according to the inventive concept. This embodiment is identical to that of FIG. 4 except that pillars PL11, PL12, PL21, and PL22 do not include an inner insulating medium 115, i.e., the channel section 114 fills the space within the stack of conductive material layers CM. Thus, this embodiment may also be used to provide a circuit equivalent to BLKa1 illustrated in FIG. 6.

In this embodiment as well, the channel sections 114 be of intrinsic semiconductor material. Also, the channel doping areas CD are formed at portions of the channel sections 114 corresponding to at least one of the upper conductive material layers CM1 to CM8. As was described with reference to FIG. 4, the dopant density of the channel doping areas gradually increases and then gradually decreases downwardly (in the first direction).

Figure 19:
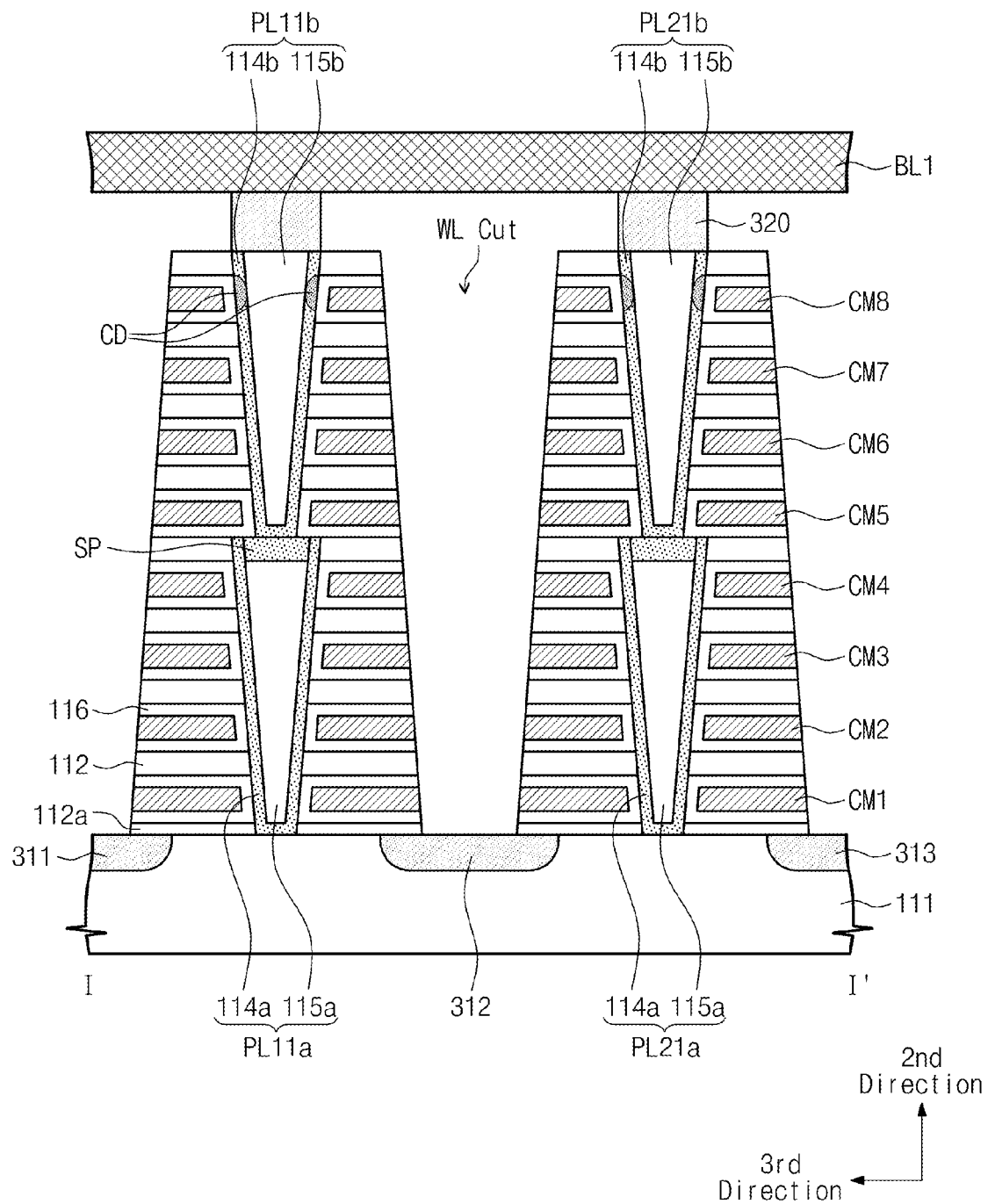
FIG. 19 is a cross-sectional view, taken along a line I-I' of FIG. 3, of a memory block of another embodiment of a nonvolatile memory device according to the inventive concept.

FIG. 19 illustrates another embodiment of a memory block of a memory cell array according to the inventive concept. This embodiment may also be used to provide a circuit equivalent to that of block BLKa1 shown in FIG. 6.

Referring to FIGS. 3, 6, and 19, this block has a group of lower pillars PL11a, PL12a, PL21a, and PL22a and a group of upper pillars PL11b, PL12b, PL21b, and PL22b.

The lower pillars PL11a, PL12a, PL21a, and PL22a each include a lower channel film 114a and a lower inner material 115a. The lower channel films 114a may be of a semiconductor material of the same conductivity type as the substrate 111 or of intrinsic semiconductor material. The lower inner material 115a comprises insulating material.

The upper pillars PL11b, PL12b, PL21b, and PL22b are provided on the lower pillars PL11a, PL12a, PL21a, and PL22a, respectively. The upper pillars PL11b, PL12b, PL21b, and PL22b each include an upper channel film 114b and upper inner material 115b. The upper channel films 114b may be of semiconductor material of the same conductivity type as the substrate 111 or of intrinsic semiconductor material. The upper inner material 115b comprises insulating material.

The lower channel films 114a and the upper channel films 114b are interconnected to form a second-direction body. To this end, semiconductor pads SP may be provided on the lower pillars PL11a, PL12a, PL21a, and PL22a to electrically couple the lower channel films 114a and the upper channel films 114b. The semiconductor pads SP may be of semiconductor material having the same conductivity type as the substrate 111 or of intrinsic semiconductor material.

In another example of this embodiment, the lower and upper inner materials 115a and 115b may be omitted and each of the upper and lower pillars may be similar to those of the embodiment of FIG. 18. That is, the upper pillars PL11b, PL12b, PL21b, and PL22b may each consist of a channel section that fills an upper part of the stack of conductive material layers (constituted by CM5, CM6, CM7 and CM8 in this example), and the lower pillars PL11a, PL12a, PL21a, and PL22a may each consist of a channel section that fills the lower part of the stack of conductive material layers (constituted by CM1, CM2, CM3 and CM4 in this example).

Figure 20:
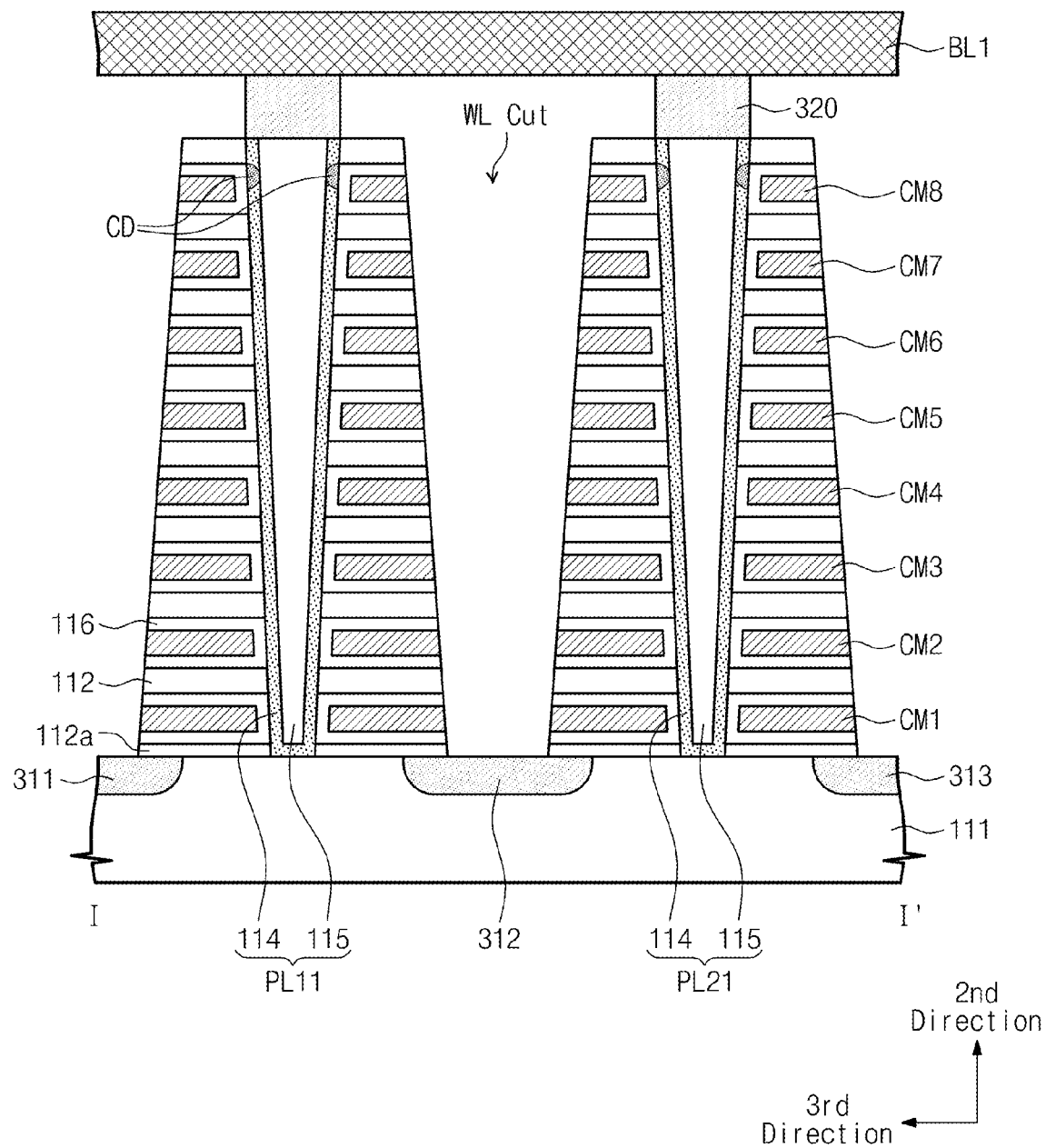
FIG. 20 is a cross-sectional view, taken along a line I-I' of FIG. 3, of a memory block of still another embodiment of a nonvolatile memory device according to the inventive concept.

FIG. 20 illustrates still another embodiment of a memory block of a memory cell array according to the inventive concept. In this embodiment, channel doping areas CD are provided at portions of channel films 114 corresponding to only the uppermost conductive material layer CM8. This embodiment can be used to provide a circuit equivalent to that shown in FIG. 21.

Figure 21:
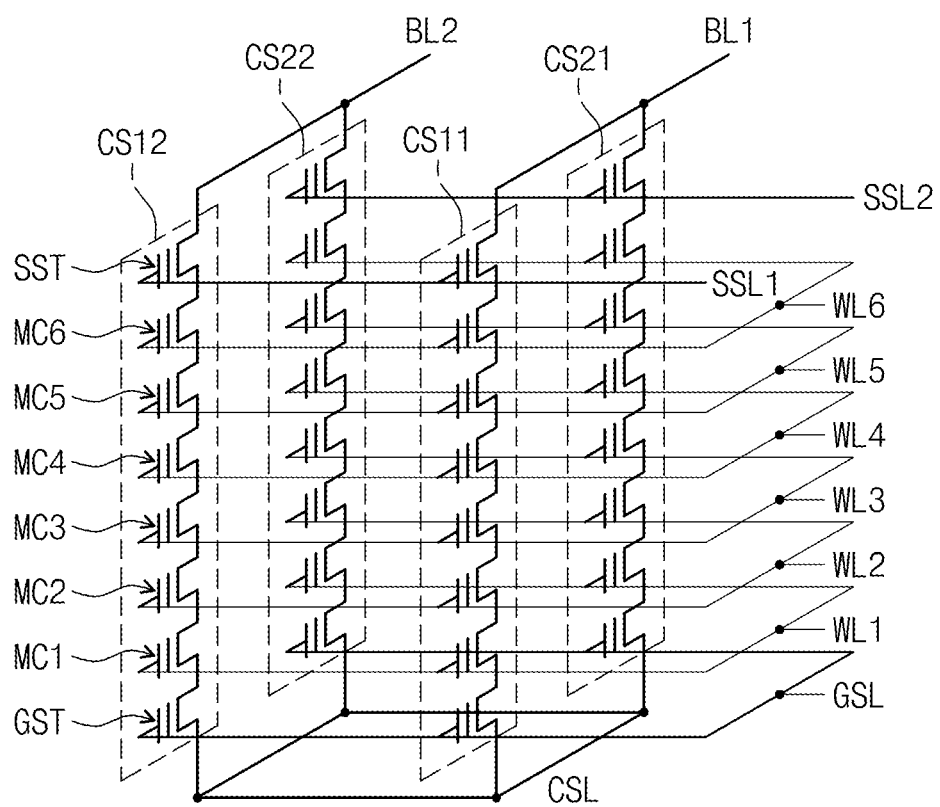
FIG. 21 is a circuit diagram illustrating an equivalent circuit of the memory block illustrated in FIG. 20.

Referring to FIGS. 3, 20, and 21, the lowermost conductive material layer CM1 constitutes a ground selection line GSL, and the uppermost conductive material layer CM8 constitutes string selection lines SSL1 and SSL2. That is, each of cell strings CS11, CS12, CS21, and CS22 may have only one string selection transistor.

In other examples of this embodiment, the pillars PL11, PL12, PL21, and PL22 have the structures of those shown in and described with reference to FIG. 18. In still another example, the pillars may comprise lower pillars PL11a, PL12a, PL21a, and PL22a and upper pillars PL11b, PL12b, PL21b, and PL22b as shown in and described with reference to FIG. 19.

Figure 22:
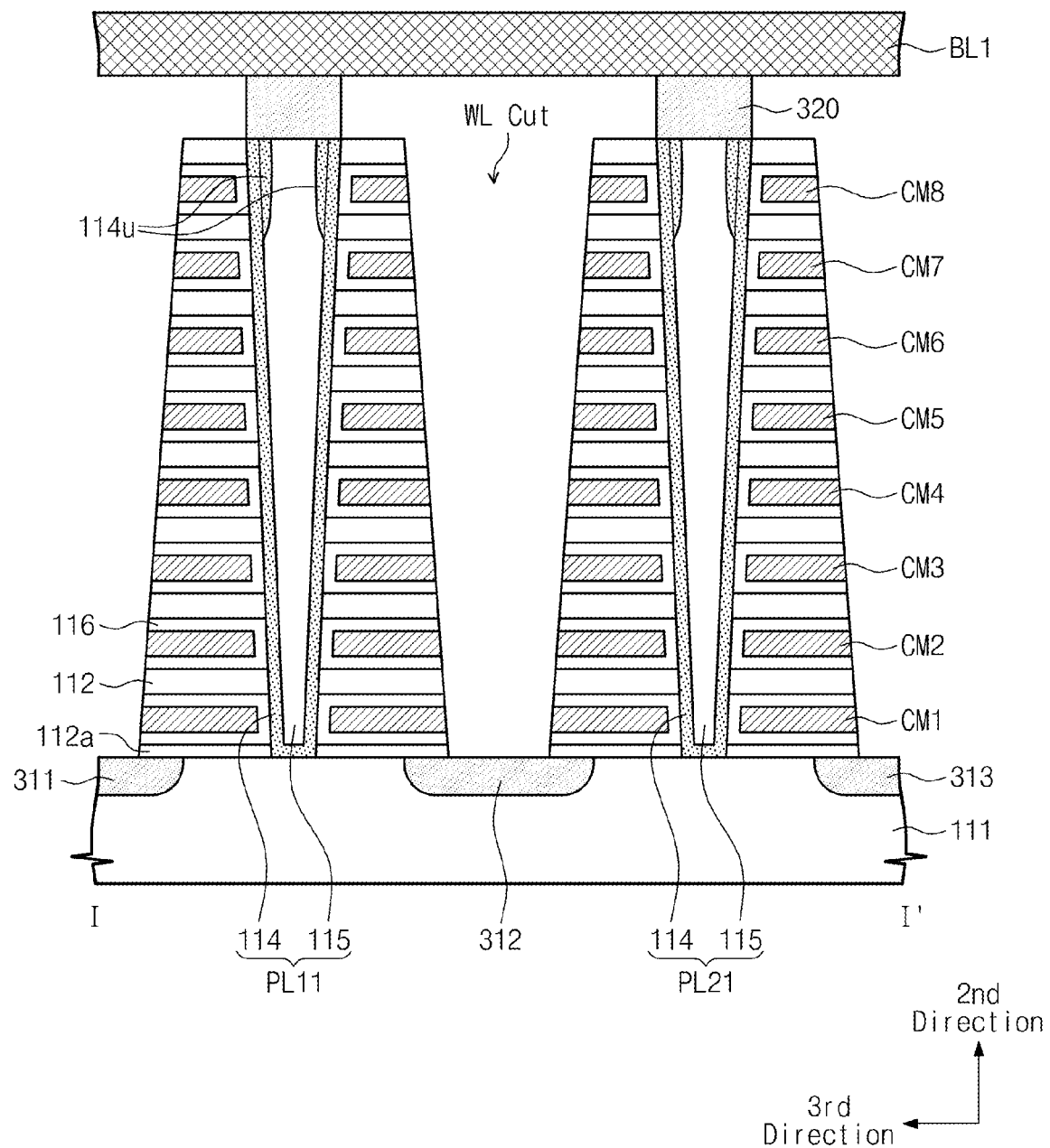
FIG. 22 is a cross-sectional view, taken along a line I-I' of FIG. 3, of a memory block of still another embodiment of a nonvolatile memory device according to the inventive concept.

FIG. 22 illustrates still another embodiment of a memory block of a memory cell array according to the inventive concept. This embodiment may also be used to provide a circuit equivalent to that of BLKa1 shown in and described with reference to FIG. 6.

Referring to FIGS. 3, 6, and 22, as with the previously described embodiments, a portion of each pillar PL11, PL12, PL21, and PL22 located at the level of at least one of the upper layers of conductive material CM is different from the other portion thereof. In this embodiment, such a difference is provided by a second channel film 114u extending along an inner surface of (first) channel film 114. The second channel films 114u may be of the same material as the first channel films 114. Note that the thickness of the second channel film 114u may increase in the second direction away from the substrate 111.

The second channel films 114u act as a vertical body with the channel films 114. Thus, the bodies of the upper string selection transistors SSTb are thicker than those of the lower string selection transistors SSTa in this example. Therefore, the threshold voltages of the upper string selection transistors SSTb may be higher than those of the lower string selection transistors SSTa. Accordingly, leakage current of a program-inhibited cell string may be reduced, so that the reliability of a nonvolatile memory device 100 is enhanced.

In an another example of this embodiment, the pillars may comprise lower pillars PL11a, PL12a, PL21a, and PL22a and upper pillars PL11b, PL12b, PL21b, and PL22b as shown in and described with reference to FIG. 19.

Figure 23:
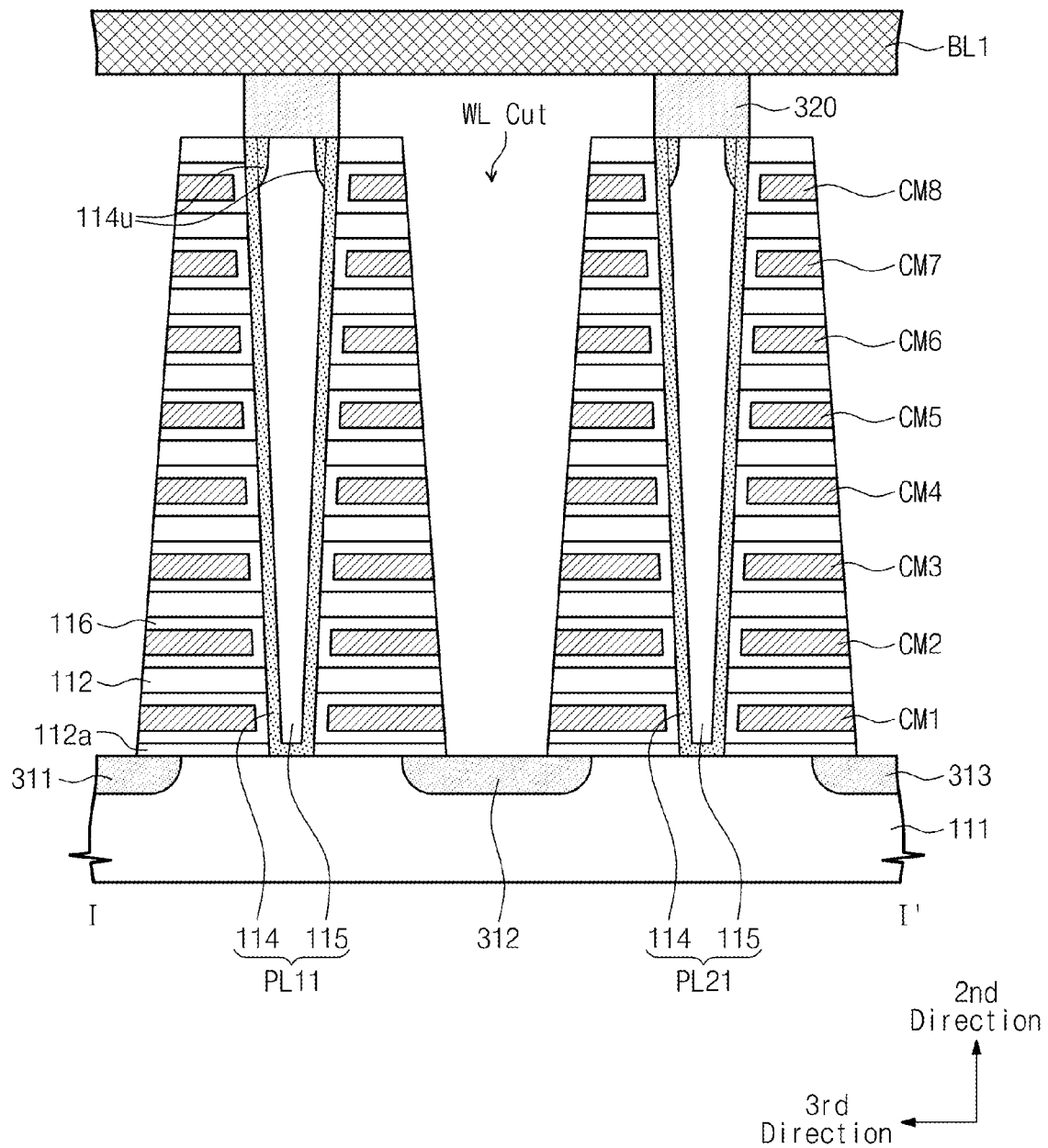
FIG. 23 is a cross-sectional view, taken along a line I-I' of FIG. 3, of a memory block of yet another embodiment of a nonvolatile memory device according to the inventive concept.

FIG. 23 illustrates still another embodiment of a memory block of a memory cell array according to the inventive concept. This embodiment is similar to that of FIG. 22 but the second channel film 114u extends over that portion of the first channel film 114 only at the level of the uppermost layer of conductive material CM8 constituting string selection transistors SST. Thus, this embodiment may be used to provide a circuit equivalent to that of BLKa1 shown in and described with reference to FIG. 21.

In another example of this embodiment, the pillars may include lower pillars PL11a, PL12a, PL21a, and PL22a and upper pillars PL11b, PL12b, PL21b, and PL22b as shown in and described with reference to FIG. 19.

Figure 24:
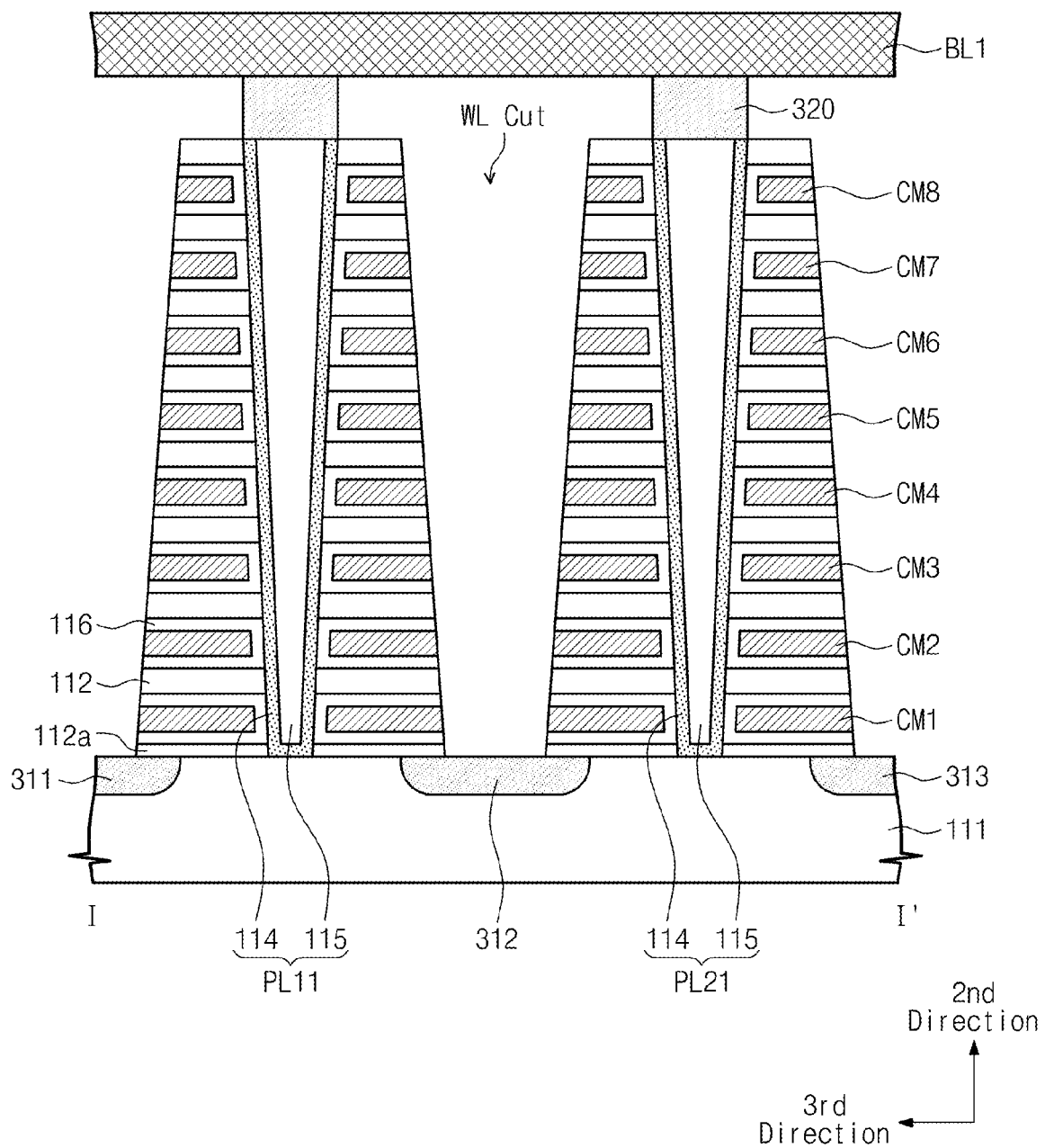
FIG. 24 is a cross-sectional view, taken along a line I-I' of FIG. 3, of a memory block of another embodiment of a nonvolatile memory device according to the inventive concept.
Figure 25:
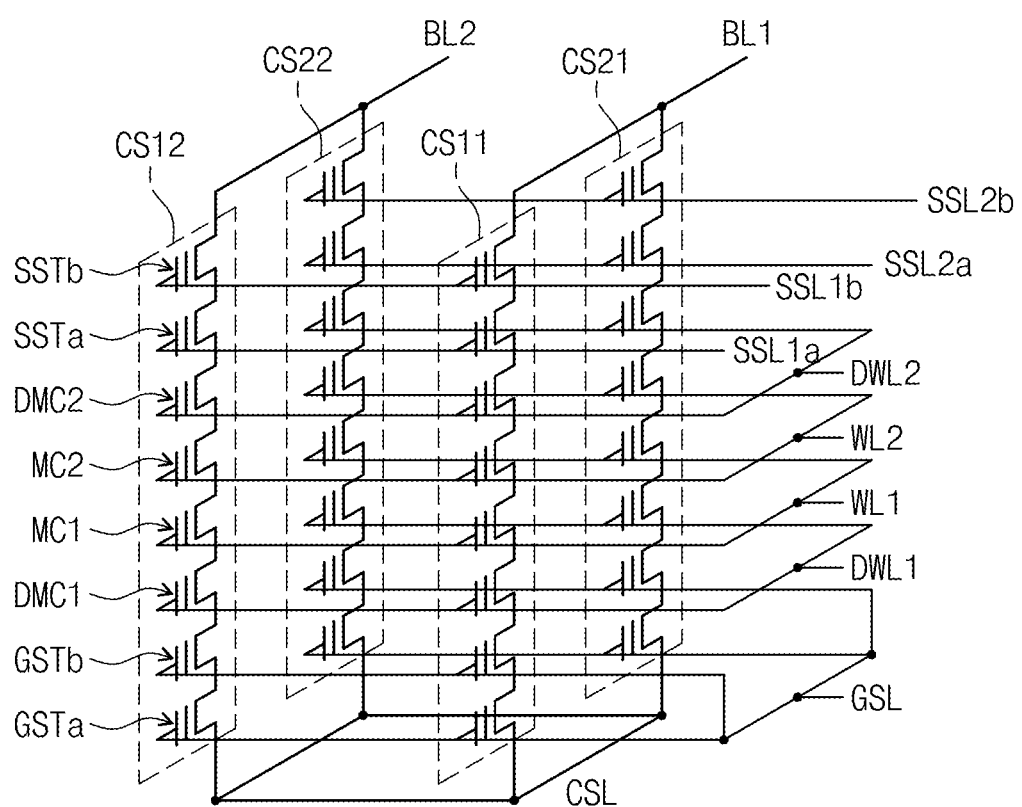
FIG. 25 is a circuit diagram illustrating an equivalent circuit of the memory block illustrated in FIG. 24.

FIG. 24 illustrates still another embodiment of a memory block of a memory cell array according to the inventive concept. FIG. 25 illustrates an equivalent circuit that is provided by the embodiment of FIG. 24.

Referring to FIGS. 3, 6, 24, and 25, in this embodiment, the channel films 114 of the pillars PL11, PL12, PL21, and PL22 do not have channel doping areas CD.

Furthermore, each row of string selection transistors is connected with a respective string selection line. Thus, in this example, the lower string selection transistors of a first row of cell strings CS11 and CS12 are connected with a string selection line SSL1a; the lower string selection transistors of a second row of cell strings CS21 and CS22 are connected with a string selection line SSL2a, the upper string selection transistors of the first row of cell strings CS11 and CS12 are connected with a string selection line SSL1b, and the upper string selection transistors of the second row of cell strings CS21 and CS22 are connected with a string selection line SSL2b.

Figure 26:
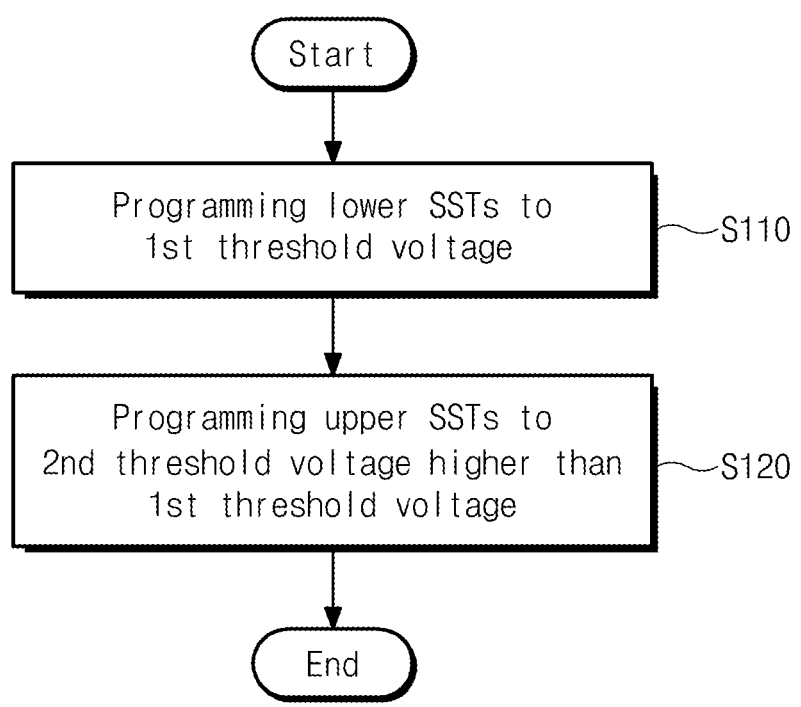
FIG. 26 is a flowchart of a method of adjusting threshold voltages of string selection transistors, according to the inventive concept.

FIG. 26 is a flowchart of a method of setting the threshold voltages of string selection transistors SSTa and SSTb. Referring to FIG. 26, in step S110, lower string selection transistors SSTa are programmed to have a first threshold voltage. In step S120, upper string selection transistors SSTB are programmed to have a second threshold voltage. Note, however, the lower and upper string selection transistors SSTa and SSTb may be programmed in any order. That is, step S120 may be carried out before S110.

According to an aspect of the inventive concept, the lower and upper string selection transistors SSTa and SSTb are programmed using a channel hot electron injection mechanism. Voltage conditions when lower and upper string selection transistors SSTa and SSTb are programmed are illustrated in the table of FIG. 27.

Figure 28:
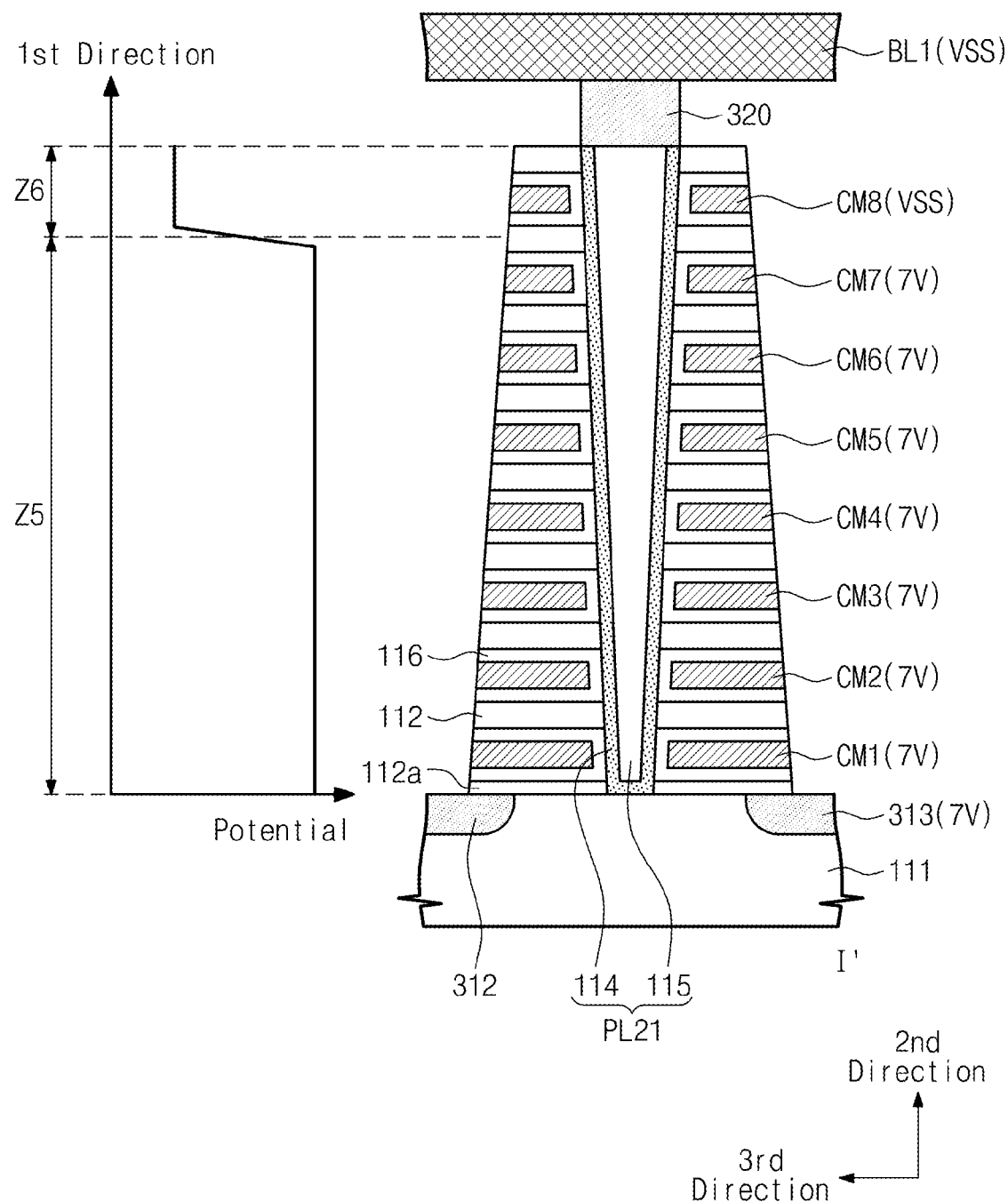
FIG. 28 is a diagram illustrating the potential of a cell string of the memory block of FIG. 24, when lower string selection transistors of the cell string are programmed, according to the inventive concept.

FIG. 28 shows the potential of cell string CS21 when lower string selection transistors SSTa are programmed.

Referring to FIGS. 25, 27 and 28, a common source line voltage VCSL is supplied to common source line CSL. At this time, the common source line voltage VCSL may be a non-selection read voltage Vread. For example, the common source line voltage VCSL is a high voltage of 7V. A ground selection line voltage VGSL is supplied to ground selection line GSL. Likewise, at this time, the ground selection line voltage VGSL is also a non-selection read voltage Vread. For example, the ground selection line voltage VGSL is also a high voltage of 7V. A word line voltage VWL is supplied to word lines WL1 and WL2. At this time, the word line voltage VWL is also a non-selection read voltage Vread. For example the word line voltage VWL is a high voltage of 7V. Furthermore, a dummy word line voltage VDWL is supplied to dummy word lines DWL1 and DWL2. At this time, the dummy word line voltage VDWL is also a non-selection read voltage Vread. For example, the dummy word line voltage VDWL is a high voltage of 7V. A first string selection line voltage VSSL1 is supplied to a lower string selection line (e.g., SSL2a) of the selected cell string CS21. At this time, the first string selection line voltage VSSL1 is a non-selection read voltage Vread. For example, the first string selection line voltage VSSL1 is a high voltage of 7V.

A second string selection line voltage VSSL2 is supplied to an upper string selection line (e.g., SSL2b) of the selected cell string CS21. The second string selection line voltage VSSL2 is a ground voltage VSS.

A high voltage (e.g., 7V) is supplied to the first to seventh conductive material layers CM1 to CM7 of the cell string CS21. Accordingly, a high voltage (e.g., 7V) supplied to doped regions 312 and 313 constituting the common source line CSL is transferred to portions of channel films 114 disposed up to the level of the seventh conductive material layer CM7. That is, a first portion Z5 of the channel films 114 corresponding to the first to seventh conductive material layers CM1 to CM7 is provided with a high potential.

A first bit line voltage VBL1 is supplied to bit lines BL1 and BL2. The first bit line voltage VBL1 is also a ground voltage VSS. Thus, a ground voltage VSS is supplied to the eighth conductive material layer CM8 of the cell string CS21. Accordingly, a second portion Z6 of the channel films 114 corresponding to the eighth conductive material layer CM8 of the cell string CS21 is provided with a low potential.

As a result, a potential difference exists between the first portion Z5 and the second portion Z6. The potential difference allows hot electrons to be generated between the first portion Z5 and the second portion Z6. The generated hot electrons are injected into the lower string selection transistors SSTa of the cell string CS21 by the high voltage (e.g., 7V) supplied to the seventh conductive material layer CM7. That is, the lower string selection transistors SSTa of the cell string CS21 may be programmed by a hot electron injection mechanism.

Figure 29:
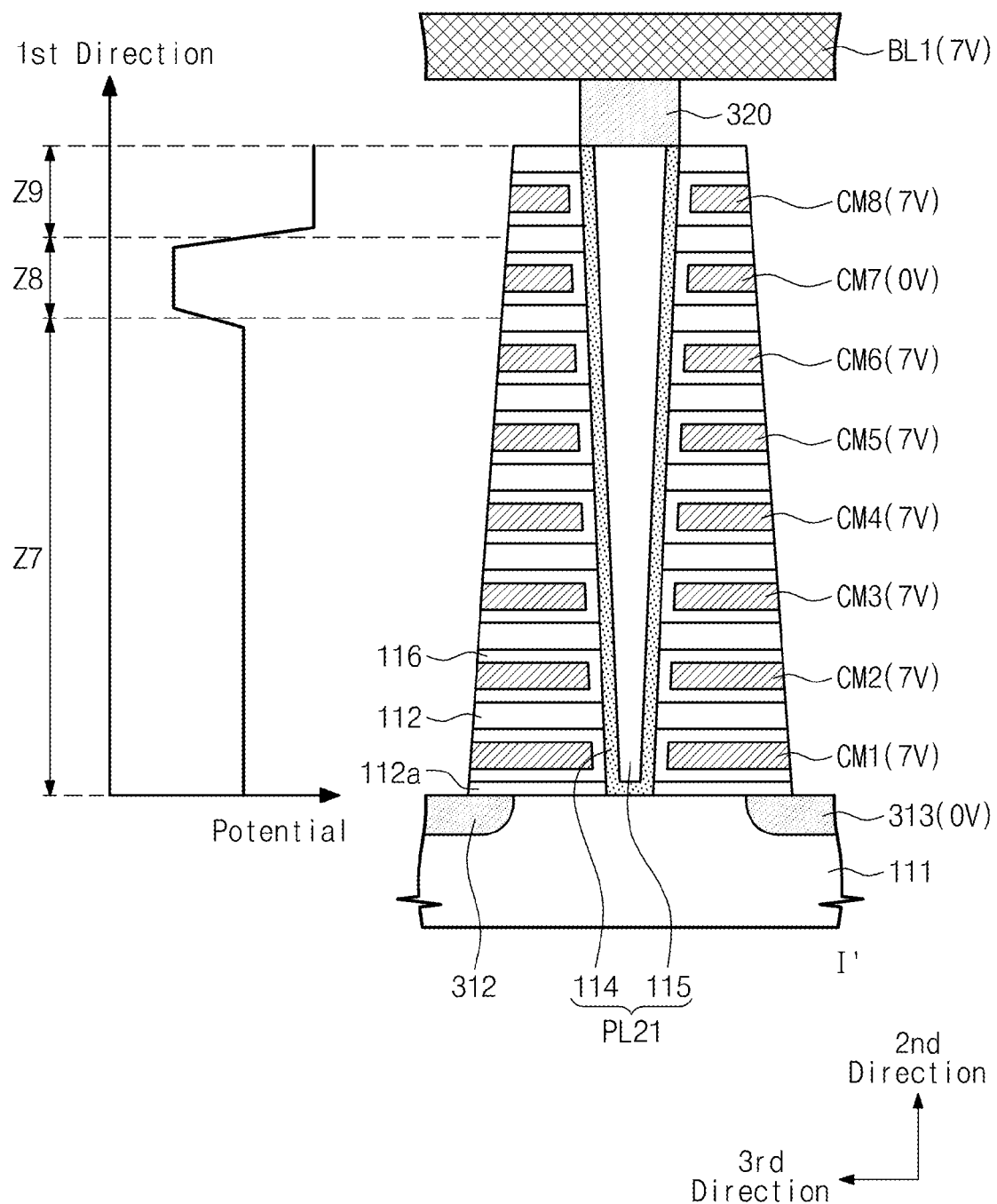
FIG. 29 is a diagram illustrating the potential of a cell string of the memory block of FIG. 24, when upper string selection transistors of the cell string are programmed, according to the inventive concept.

FIG. 29 illustrates a cell string (again, the cell string CS21, for example) when the lower string selection transistors are programmed.

Referring to FIGS. 25, 27 and 29, the common source line voltage VCSL supplied to common source line CSL is a ground voltage VSS. The ground selection line voltage VGSL supplied to ground selection line GSL is a non-selection read voltage Vread. The word line voltage VWL supplied to word lines WL1 and WL2 is also a non-selection read voltage Vread. The dummy word line voltage VDWL supplied to dummy word lines DWL1 and DWL2 is also a non-selection read voltage Vread. For example, the non-selection read voltage Vread are each a high voltage of 7V.

A third string selection line voltage VSSL4 is supplied to lower string selection line (e.g., SSL2a) of a selected cell string CS21. The third string selection line voltage VSSL3 is the ground voltage VSS.

A fourth string selection line voltage VSSL4 is supplied to an upper string selection line (e.g., SSL2b) of the selected cell string CS21. The second string selection line voltage VSSL2 is also a non-selection read voltage Vread, e.g., a high voltage of 7V.

A high voltage (e.g., 7V) is supplied to first to sixth conductive material layers CM1 and CM6 of the cell string CS21. Accordingly, the ground voltage supplied to doping regions 312 and 313 constituting common source line CSL is transferred to portions of channel films 114 corresponding to the sixth conductive material layer CM6. That is, a third portion Z7 of the channel films 114 corresponding to the first to sixth conductive materials CM1 to CM7 may have a low potential, e.g., a ground potential.

The ground voltage VSS is also supplied to the seventh conductive material layer CM7 of the cell string CS21. Accordingly, the lower string selection transistors SST2a corresponding to the seventh conductive material layer CM7 of the cell string CS21 are turned off. Thus, a fourth portion Z8 of the channel films 114 corresponding to the seventh conductive material layer CM7 of the cell string CS21 is provided with a potential lower than ground potential.

A second bit line voltage VBL2 is supplied to bit lines BL1 and BL2. The second bit line voltage VBL2 is also a non-selection read voltage Vread, e.g., a high voltage of 7V. Thus, a high voltage (e.g., 7V) is supplied to eighth conductive material layer CM8 of the cell string CS21. Accordingly, a fifth portion Z9 of the channel films 114 corresponding to the eighth conductive material layer CM8 of the cell string CS21 is provided with a high potential.

As a result, a potential difference exists between the fourth portion Z8 and the fifth portion Z9. The potential different allows hot electrons to be generated between the fourth portion Z8 and the fifth portion Z9. The generated hot electrons are injected into the upper string selection transistors SSTb of the cell string CS21 due to the high voltage (e.g., 7V) supplied to the eighth conductive material layer CM8 of the cell string CS21. That is, the upper string selection transistors SSTb of the cell string CS21 are programmed by a hot electron injection mechanism.

Figure 30:
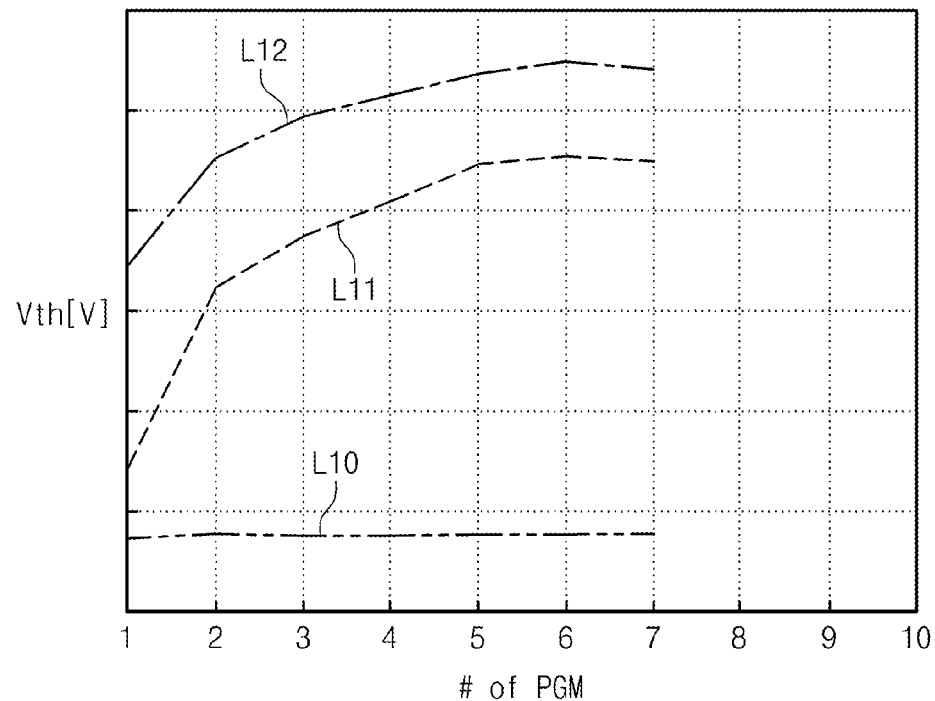
FIG. 30 is a graph of the threshold voltages of the selection transistors of a cell string of the memory block of FIG. 24, while the upper string selection transistors are being programmed.

FIG. 30 is a graph characteristic of an embodiment of a memory block according to the inventive concept, providing a circuit equivalent to that shown in FIG. 25, as upper string selection transistors of the cell string are being programmed. In FIG. 30, the number of iterations of a programming operation is plotted along the horizontal axis, and the threshold voltage of string selection transistors is plotted along the vertical axis. In this example, a high voltage of about 7V was used for the programming operation.

Referring to FIGS. 25 and 30, the plot L10 indicates the threshold voltage of a lower string selection transistor SSTa of the cell string when an upper string selection transistor SSTb is programmed iteratively. At this time, the lower string selection transistor SSTa is not programmed.

The plot L11 indicates values of the threshold voltage of the upper string selection transistor SSTb of the cell string while it is being programmed iteratively. During this operation, the threshold voltage of the upper string selection transistor SSTb is increased gradually.

The plot L12 indicates a total threshold voltage of the lower and upper string selection transistor SSTa and SSTb. The total threshold voltage is the voltage that is sufficient to turn on the lower and upper string selection transistor SSTa and SSTb when driving upper and lower string selection lines SSL1a, SSL1b, SSL2a, and SSL2b with the same voltage. When the upper string selection transistor SSTb is programmed iteratively, the total threshold voltage is increased gradually.

Figure 31:
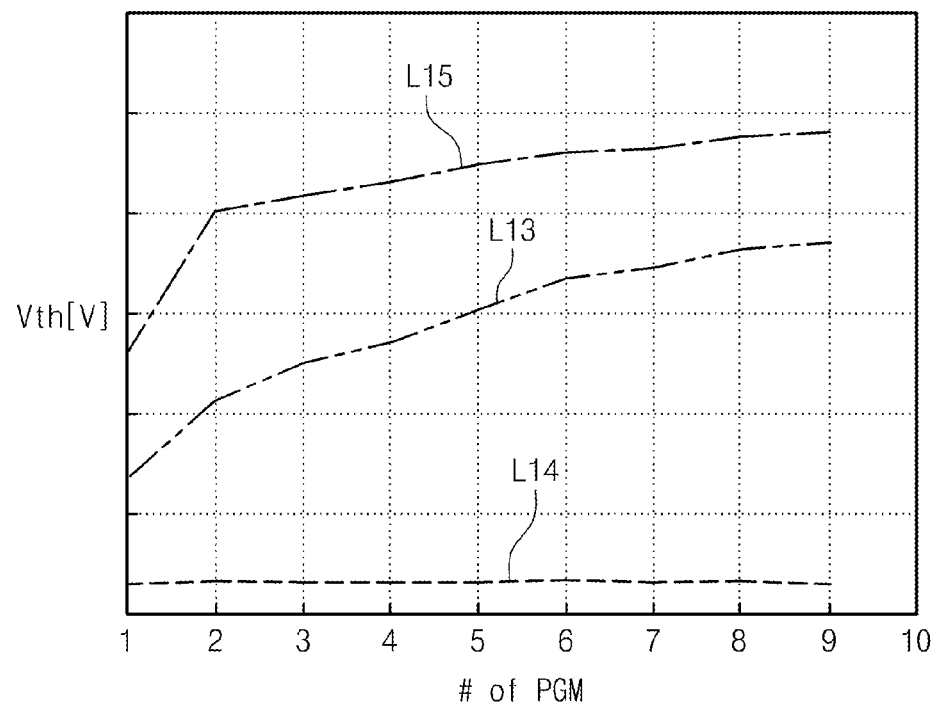
FIG. 31 is a graph of the threshold voltages of the selection transistors of a cell string of the memory block of FIG. 24, while the lower string selection transistors are being programmed.

FIG. 31 is a graph characteristic of an embodiment of a memory block according to the inventive concept, providing a circuit equivalent to that shown in FIG. 25, as lower string selection transistors of the cell string are being programmed. In FIG. 31, the number of iterations of a programming operation is plotted along the horizontal axis, and the threshold voltage of string selection transistors is plotted along the vertical axis. In this example, too, a high voltage of about 7V was used for the programming operation.

Referring to FIGS. 25 and 31, plot L13 indicates the threshold voltage of a lower string selection transistor SSTa of the cell string while it is being programmed iteratively. During this operation, the threshold voltage of the lower string selection transistor SSTa is increased gradually.

The plot L14 indicates a threshold voltage of an upper string selection transistor SSTb of the cell string. When the lower string selection transistor SSTa is programmed iteratively. The upper string selection transistor SSTa is not programmed at this time.

The L15 indicates a total threshold voltage of the lower and upper string selection transistors SSTa and SSTb. As mentioned above, the total threshold voltage is a voltage sufficient to turn on the lower and upper string selection transistor SSTa and SSTb when driving upper and lower string selection lines SSL1a, SSL1b, SSL2a, and SSL2b with the same voltage. When the lower string selection transistor SSTa is programmed iteratively, the total threshold voltage is increased gradually.

As illustrated in FIGS. 30 and 31, the lower and upper string selection transistors SSTa and SSTb can be programmed independently from each other. Accordingly, a leakage current of a program-inhibited cell string may be reduced by programming the lower and upper string selection transistors SSTa and SSTb. As a result, the reliability of a nonvolatile memory device 100 can be enhanced.

Figure 32:
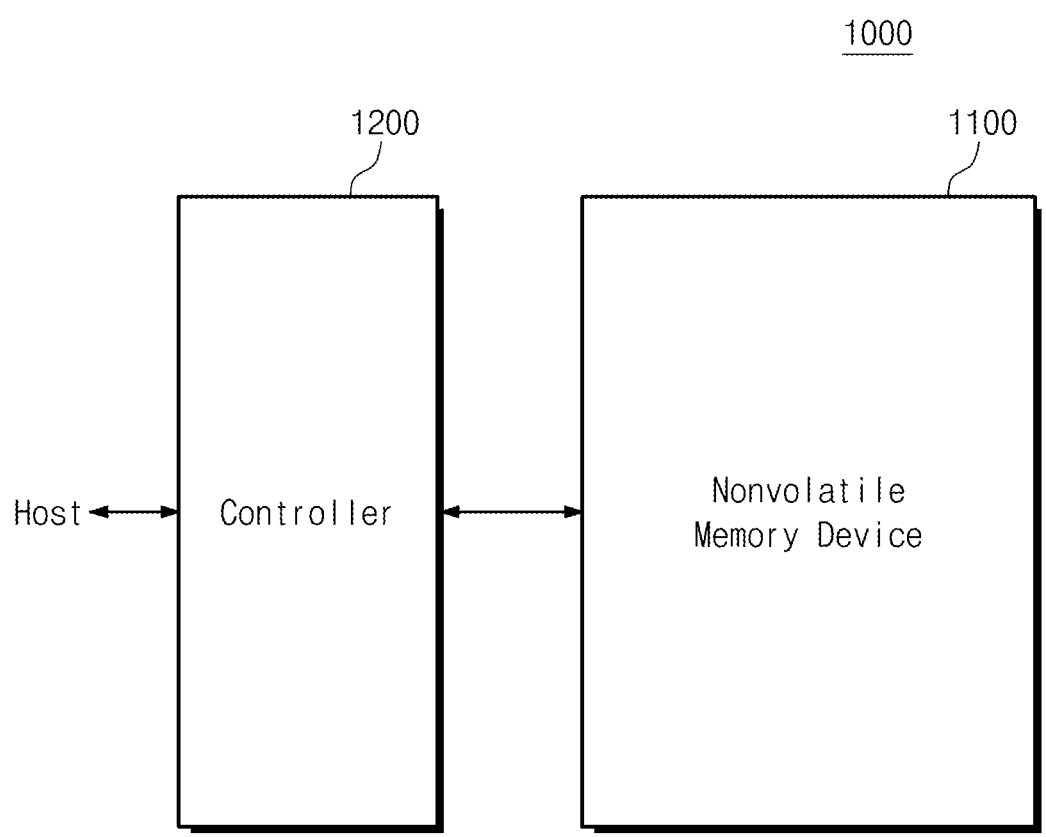
FIG. 32 is a block diagram of an example of a memory system according to the inventive concept.

FIG. 32 illustrates an example of a memory system according to the inventive concept. This example of a memory system 1000 includes a nonvolatile memory device 1100 and a controller 1200.

The nonvolatile memory device 1100 is has the form of any of the nonvolatile memory devices described above. That is, the nonvolatile memory device 1100 may include a plurality of cell strings CS11, CS12, CS21, and CS22 provided on a substrate 111, the cell strings CS11, CS12, CS21, and CS22 being constituted by pillars PL11, PL12, PL21, and PL22, respectively, and each cell string including a plurality of cell transistors CT stacked in a direction perpendicular to the substrate 111. Upper portions of the pillars PL11, PL12, PL21, and PL22 may have different structures than lower portions thereof, as provided by channel doping areas CD or second channel films 114u. Alternatively, each cell string may include at least two string selection transistors of which an upper string selection transistor is programmed to have a threshold voltage higher than that of a lower string selection transistor.

The controller 1200 can be coupled with a host and is coupled with the nonvolatile memory device 1100 such that the controller 1200 accesses the nonvolatile memory device 1100 in response to a request from the host. Also, the controller 1200 may be configured to drive firmware for controlling the nonvolatile memory device 1100. The controller 1200 can also be configured with a protocol that provides an interface between the nonvolatile memory device 1100 and the host.

More specifically, in this example, the controller 1200 is configured control read, program, erase, and background operations of the nonvolatile memory portion 1100, for example. In particular, the controller 1200 is configured to provide a control signal CTRL and an address ADDR to the nonvolatile memory device 1100, and the nonvolatile memory device 1100 is configured to perform read, erase, and write operations in response to the control signal CTRL and the address ADDR from the controller 1200.

The controller 1200 may include additional components such as a RAM, a processing unit, a host interface, a memory interface, and the like.

In this case, the RAM may constitute at least one of a working memory of the processing unit, a cache memory between the nonvolatile memory device 1100 and the host, or a buffer memory between the nonvolatile memory device 1100 and the host. The processing unit may control an overall operation of the controller 1200.

The host interface may include the protocol for executing data exchange between the host and the controller 1200. For example, the controller 1200 may communicate with an external device (e.g., the host) via at least one of various protocols such as a USB (Universal Serial Bus) protocol, an MMC (multimedia card) protocol, a PCI (peripheral component interconnection) protocol, a PCI-E (PCI-express) protocol, an ATA (Advanced Technology Attachment) protocol, a Serial-ATA protocol, a Parallel-ATA protocol, a SCSI (small computer small interface) protocol, an ESDI (enhanced small disk interface) protocol, and an IDE (Integrated Drive Electronics) protocol. The memory interface may interface with the nonvolatile memory device 1100. The memory interface may comprise a NAND interface or a NOR interface.

The memory system 1000 may further include an ECC block. Such an ECC block is configured to detect and correct errors in data read from the nonvolatile memory device 1100. The ECC block may be provided as a component of the controller 1200 or as a component of the nonvolatile memory device 1100.

Furthermore, the controller 1200 and the nonvolatile memory device 1100 may be integrated as a single semiconductor device. For example, the controller 1200 and the nonvolatile memory device 1100 may be integrated as a memory card such as a PC (PCMCIA) card, a CF card, an SM or SMC card, a multimedia card (MMC, RS-MMC, MMCmicro), a security card (SD, miniSD, microSD, SDHC), a memory stick, or a universal flash storage (UFS) device. Alternatively, the controller 1200 and the nonvolatile memory device 1100 may be integrated to form a solid state drive (SSD). The SSD may be configured to store data in a semiconductor memory. If the memory system 1000 is used as an SSD, the speed at which a host coupled with the memory system 1000 can operate is remarkably improved.

In addition, the memory system 1000 may be employed by a desk top computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, or a 3-dimensional television. More generally speaking, the memory system 1000 may be employed as the memory of basically any wireless device capable of transmitting and receiving information, of the various electronic devices which constitute home networks, of the various electronic devices which constitute computer networks, of the various electronic devices which constitute telematics networks, of an RFID, or of the various electronic devices which constitute computing systems.

Still further, the nonvolatile memory device 1100 or memory system 1000 thereof may be packaged in various ways. For example, the nonvolatile memory device 1100 or memory system 1000 thereof may be assembled as part of a PoP (Package on Package), Ball grid array (BGA) package, Chip scale package (CSP), Plastic Leaded Chip Carrier (PLCC), Plastic Dual In-Line Package (PDI2P), Die in Waffle Pack, Die in Wafer Form, Chip On Board (COB) package, Ceramic Dual In-Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), Thin Quad Flatpack (TQFP), System In Package (SIP), Multi Chip Package (MCP), or Wafer-level Fabricated Package (WFP), Wafer-Level Processed Stack Package (WSP).

Figure 33:
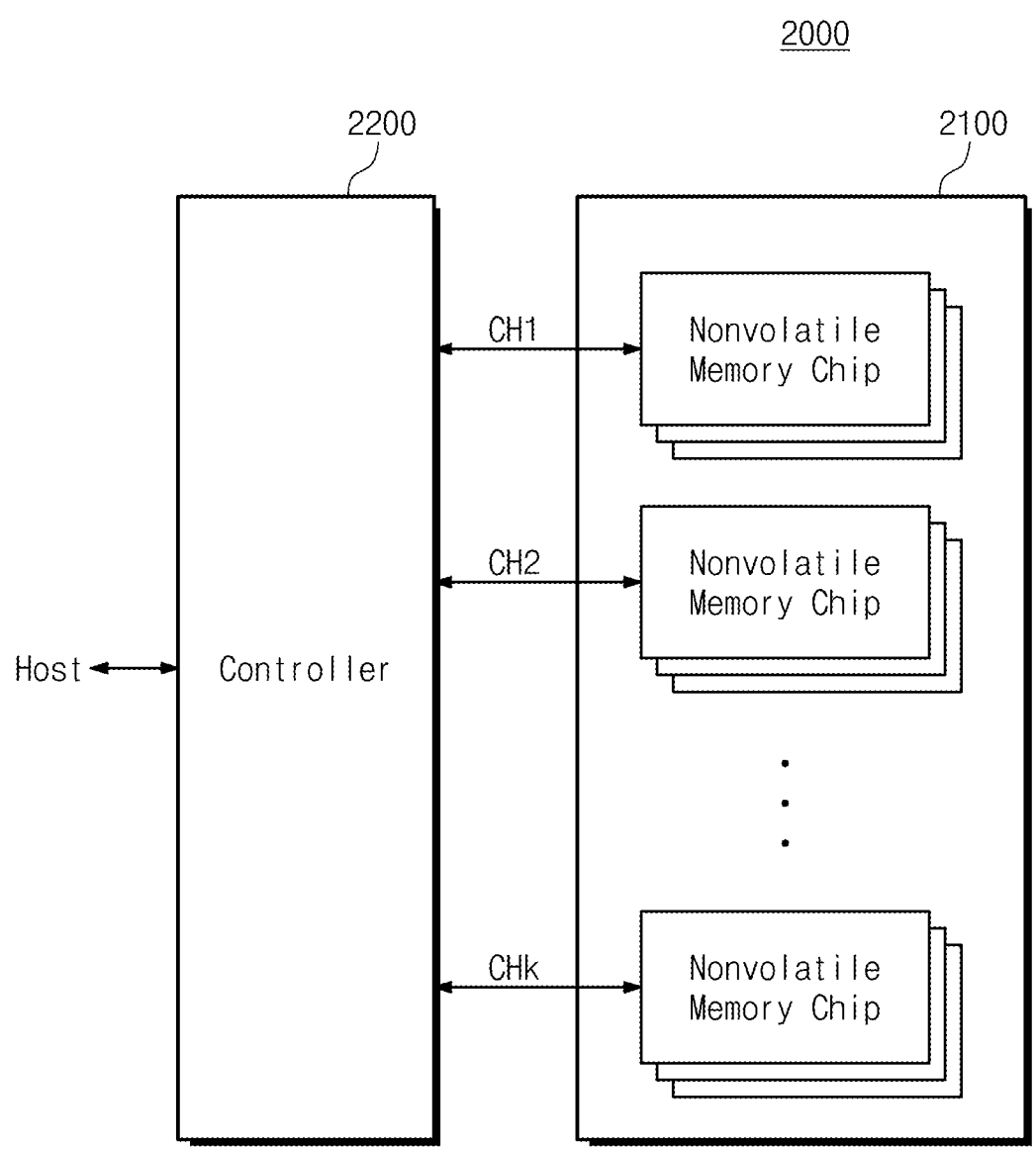
FIG. 33 is a block diagram of an application of the memory system of FIG. 32 according to the inventive concept.

FIG. 33 illustrates a memory system as an application of the type shown in and described with FIG. 32. Referring to FIG. 33, thus, the memory system 2000 includes a nonvolatile memory device 2100 and a controller 2200.

More specifically, the nonvolatile memory device 2100 includes a plurality of groups of nonvolatile memory chips. Each of the nonvolatile memory chips may be a nonvolatile memory device 100 according to the inventive concept, as described above with reference to FIG. 32. In this example, the nonvolatile memory chips of each group communicate with the controller 2200 via a common channel. That is, FIG. 33 illustrates an example in which the groups of memory chips communicate with the controller 2200 via a plurality of channels CH1 to CHk, respectively. However, the memory system 2000 may be instead configured such that the nonvolatile memory chips communicate with the controller 2200 via a plurality of channels, respectively, i.e., each chip has a dedicated channel for communicating with the controller.

Figure 34:
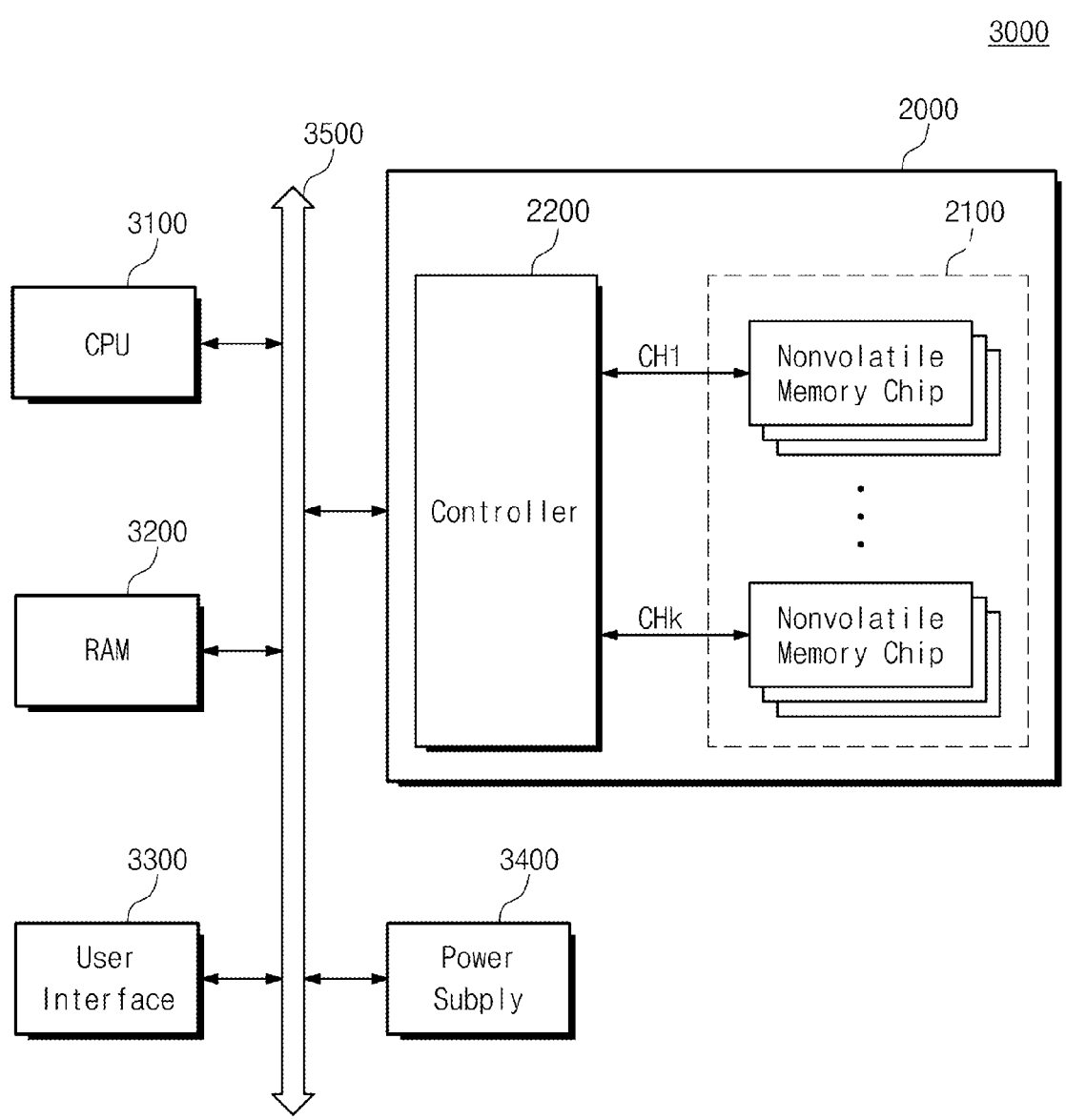
FIG. 34 is a block diagram of an example of a computing system according to the inventive concept.

FIG. 34 illustrates a computing system including a memory system of the type shown in and described with reference to FIG. 33. However, a computing system according to the inventive concept may instead include a memory system of the type shown in described with reference to FIG. 32.

Referring to FIG. 34, this example of a computing system 3000 includes a CPU 3100, a RAM 3200, a user interface 3300, a power supply 3400, and a memory system 2000. The memory system 2000 is electrically connected with the CPU 3100, the RAM 3200, the user interface 3300, and the power supply 3400. Data provided via the user interface 3300 or processed by the CPU 3100 may be stored in the memory system 2000.

Also, in the example illustrated in FIG. 34, the nonvolatile memory device 2100 is connected with a system bus 3500 via a controller 2200. However, the nonvolatile memory device 2100 may instead be connected directly with the system bus 3500.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A nonvolatile memory device comprising:
a substrate;
a stack of alternately disposed layers of electrically conductive and insulating materials on the substrate;
a plurality of pillars extending through the stack in a direction perpendicular to the substrate and disposed in contact with the substrate; and
information storage films interposed between the layers of conductive material and the pillars,
wherein each of the pillars comprise a channel section adjacent the layers of conductive material and constituting vertical channels at substantially the same levels as the layers of conductive material, respectively, and an upper portion of the channel section adjacent an upper one of the layers of conductive material has a different degree of conductivity from each of remaining portions of the channel section adjacent the other layers of conductive material, respectively.

2. The nonvolatile memory device of claim 1, wherein the upper portion of the channel section is a region of the channel section doped with impurities, and the concentration of the impurities varies along the upper portion of the channel section in a direction towards the substrate.

3. The nonvolatile memory device of claim 2, wherein the concentration increases and then decreases along the upper portion of the channel section in the direction towards the substrate.

4. The nonvolatile memory device of claim 2, wherein the remaining portions are each of undoped intrinsic semiconductor material.

5. The nonvolatile memory device of claim 1, wherein the pillars each include outer channel film and an inner insulating medium disposed inwardly of the channel film, the channel film constitutes the vertical channels, and the thickness of an upper portion of the channel film adjacent the upper one of the layers of conductive material being different from each of remaining portions of the channel film adjacent the other layers of conductive material, respectively.

6. The nonvolatile memory device of claim 5, wherein the thickness of the upper portion of the channel film increases in a direction away from the substrate.

7. The nonvolatile memory device of claim 5, wherein the upper portion of the channel film is thicker at each part thereof than the remaining portions of the channel film.

8. The nonvolatile memory device of claim 1, wherein the upper portion of the channel section is adjacent the uppermost one of the layers of conductive material of the stack through which the pillars extend.

9. The nonvolatile memory device of claim 8, wherein the upper portion of the channel section is a region of the channel section doped with impurities, and the concentration of the impurities of the upper portion of the channel section is higher than that of any of the remaining portions of the channel section.

10. The nonvolatile memory device of claim 8, wherein the pillars each include outer channel film and an inner insulating medium disposed inwardly of the channel film, the channel film constitutes the vertical channels, and the upper portion of the channel film adjacent the uppermost one of the layers of conductive material is thicker than that of each of remaining portions of the channel film adjacent the other layers of conductive material, respectively.

11. A nonvolatile memory device comprising:
a substrate; and
a plurality of cell strings on the substrate,
wherein each of the cell strings includes a plurality of cell transistors stacked in a direction perpendicular to the substrate,
a plurality of the cell transistors at the top of each of the cell strings constitute a plurality of string selection transistors, respectively,
at least two of the string selection transistors have different threshold voltages,
each of the plurality of cell strings includes a channel film constituting channel regions of the cell transistors, respectively, and
a first portion of the channel film constituting an upper one of the at least two string selection transistors is thicker than a second portion of the channel film constituting a lower one of the at least two string selection transistors.

12. The nonvolatile memory device of claim 11, wherein the threshold voltage of the upper one of the at least two string selection transistors is higher than that of the lower one of the at least two string selection transistors.

13. A nonvolatile memory device, comprising:
a substrate having a first region of a first conductivity type and a source region of a second conductivity type; and
an array of cell strings on the substrate, each of the cell strings comprising a respective stack of gate electrodes, a vertical pillar comprising semiconductor material of the first conductivity type contacting the first region the substrate, an information storage film interposed between each of the gate electrodes and the pillar, and a drain disposed on the pillar, and
wherein the gate electrodes, the vertical pillar and the information storage film interposed between each of the gate electrodes and the pillar of each of the cell strings constitute a plurality of cell transistors including memory cell transistors, a lower string selection transistor disposed on the memory cell transistors and an upper string selection transistor disposed on the lower string selection transistor, and
the upper and lower string selection transistors of each of the cell strings are characterized in that the upper string selection transistor of the cell string has a potential lower than that of the lower string selection transistor of the cell string when the cell string is program inhibited and the same voltage is applied to the upper and lower string selection transistors.

14. The nonvolatile memory device of claim 13, wherein a first portion of the vertical pillar constituting the upper string selection transistor is doped with impurities, and a second portion of the vertical pillar constituting the lower string selection transistor has a lower concentration of impurities than the first portion.

15. The nonvolatile memory device of claim 14, wherein the second portion of the vertical pillar is an undoped portion of semiconductor material.

16. The nonvolatile memory device of claim 13, wherein the pillar of each of the cell strings includes a channel film of the semiconductor material, and a first portion of the channel film constituting the upper string selection transistor of the cell string is thicker than a second portion of the channel film constituting the lower string selection transistor of the cell string.

* * * * *